(12) United States Patent
Sugiyama et al.

(10) Patent No.: US 6,308,305 B1
(45) Date of Patent: *Oct. 23, 2001

(54) METHOD AND APPARATUS FOR CIRCUIT DESIGNING OF AN LSI CIRCUIT WITHOUT ERROR PATHS

(75) Inventors: Hiroyuki Sugiyama; Yasunori Abe; Naomi Bizen, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/874,506

(22) Filed: Jun. 13, 1997

(30) Foreign Application Priority Data

Jan. 16, 1997 (JP) ...................................................... 9-005780

(51) Int. Cl.[7] ...................................................... G06F 17/50
(52) U.S. Cl. .................................................................. 716/6
(58) Field of Search ........................ 395/500.02; 716/6, 716/12

(56) References Cited

U.S. PATENT DOCUMENTS 5,796,623 * 8/1998 Butts ............................... 395/500.02
5,889,677 * 3/1999 Yasuda ..................................... 716/6

FOREIGN PATENT DOCUMENTS 63-293678    11/1988 (JP).

* cited by examiner

Primary Examiner—Matthew Smith
Assistant Examiner—Thuan Do
(74) Attorney, Agent, or Firm—Staas & Halsey LLP

(57) ABSTRACT

There are disclosed a method and an apparatus for circuit designing, which enable arranging and wiring operations to be efficiently performed by using indices for arranging and wiring without the occurrence of any error paths. In the method and apparatus for circuit designing, path tracing is performed from one or more tracing start pins for a result of logical designing and the number of passing through each pin of cells to be arranged is counted during the path tracing. Thus, the method and apparatus for circuit designing are suitably used for designing of a circuit such as a LSI or the like, which has been enlarged in size and complex following an advance in a micro fabrication art.

18 Claims, 14 Drawing Sheets

METHOD AND APPARATUS FOR CIRCUIT DESIGNING OF AN LSI CIRCUIT WITHOUT ERROR PATHS

BACKGROUND OF THE INVENTION

1) Field of the Invention

The present invention relates to a method and an apparatus suitably used for circuit designing of a LSI, which has become larger in its size and more complex following an advance in a micro fabrication art in recent years.

2) Description of the Related Art

Generally, LSI designing is performed based on a procedure shown in FIG. 14. This procedure includes steps as follows. First, logical designing is performed for a circuit (LSI) to be designed (step S1), then cells (circuit elements) are arranged based on the result of this logical designing (step S2) and a timing is checked for the result of this arrangement (step S3).

For a timing check, a delay value is calculated for each path while performing path tracing for the arranging result of the cells, and determination is made as to whether this value satisfies a timing condition or not. At this time, however, wiring has not beer decided yet among the cells. Thus, a delay value for each path is calculated by estimating a delay value which arises because of wiring (net) among the cells by using a Manhattan distance, and so on.

If the result of the timing check shows that there is an error path which does not satisfy the timing condition, arranging of the cells is performed again (from NO route of step S4 to step S2). This rearranging of the cells (improvement of the arrangement) is repeated until the error path is canceled (until YES determination is made in step S4).

If the result of the cell arrangement satisfies the timing condition (YES determination is made in step S4), wiring is performed among the cells which have been arranged in step S2 (step S5), and a timing check similar to that described above is also performed for this wiring result (step S6).

For this timing check, a delay value for each path is calculated based on an actual wiring length by performing path tracing for the wiring result among the cells, and determination is made as to whether the value satisfies the timing condition or not.

If the result of the timing check shows that there is an error path which does not satisfy the timing condition, wiring among the cells is performed again (from NO route of step S7 to step S5). This rewiring (improvement of the wiring) is repeated until the error path is canceled (until YES determination is made in step S7). If the result of the cell arrangement satisfies the timing condition (YES determination is made in step S7), designing is finished.

On the other hand, if the timing condition is not satisfied even by the repeated rearranging or rewiring operation (no YES determination is made in step S4 or S7), the process returns to step S1. Then, the process is started all over again from logical designing.

With an advance in a micro fabrication art in recent years, a LSI has become extremely large in its circuit size and complex. For this complicated circuit, a data timing problem must be solved among flip-flops (sequential circuit cells; referred to as FFs, hereinafter), which amount to a million and several hundred thousands in number.

Therefore, simple arranging of the cells or wiring among the cells without any indices is liable to lead to the occurrence of error paths. It is thus preferred that arranging or wiring should be efficiently performed by using. Certain indices for arranging or wiring so as to limit the generation of error paths as much as possible. For the improvement of arranging or wiring, it is also preferred that error paths are not simply improved, but rather these paths should be efficiently canceled (corrected) by using certain indices for improvements.

If logical designing is automatically performed based on logical synthesis while a circuit has become extremely large in its size and complexity, the number of gate stages among FFs may increase more than that expected by a designer. In this case, the designer recognizes a path (multi-stage path, and so on) having the unexpected number of gate stages among FFs as a critical path (path which is too short or too long) for the first time by a timing check (delay analysis), which is performed after arranging or wiring. However, even if the critical path is recognized at this time, it is difficult to cancel this critical path during rearranging or rewiring, and thus logical designing must be performed again. Consequently, a great increase occurs in the number of steps. Therefore, it is necessary to prevent the generation of unexpected multi-stage paths during logical designing.

Furthermore, during the correcting process of the arrangement or the wiring performed while the circuit size is large as described above, the degree of permissibility for changing the arrangement or the wiring becomes extremely small toward the end of packaging designing (including arranging, wiring, and so on), and accordingly it becomes difficult to make any changes. If an arrangement or wiring is changed for a spot which needs correction, other spots may be adversely affected, and in the worst case logical designing must be performed all over again. Consequently, a great increase may occur in the number of designing steps.

SUMMARY OF THE INVENTION

The present invention was made in order to solve the problems discussed above. It is a first object of the present invention to provide a method and an apparatus for circuit designing, whereby arranging and wiring are efficiently performed by using indices for arranging or wiring without the occurrence of any error paths.

The first object of the present invention is achieved by a circuit designing method, which comprises the steps of performing logical designing for a circuit to be designed, performing path tracing from one or more tracing start pins for the result of the logical designing when wiring is performed among cells after the cells are arranged based on the result of the logical designing, and counting the number of passing through each pin of the cells to be arranged during this path tracing.

In order to implement the circuit designing method described above, there is provided a circuit designing apparatus, which comprises a logical designing unit for performing logical designing for a circuit to be designed, an arranging unit for arranging cells based on the result of logical designing performed by this logical designing unit, a wiring unit for performing wiring among the cells arranged by this arranging unit, a path tracing unit for performing path tracing from one or more tracing start pins for the logical designing result of the logical designing unit, and a passing number counting unit for counting the number of passing through each pin of the cells to be arranged during path tracing performed by this path tracing unit.

With the circuit designing method and apparatus of the present invention, a passing number (static signal propagating density) of a path through each pin is calculated by performing path tracing after logical designing, and this passing number is used as an index for arranging or wiring. Accordingly, it is possible to perform arranging and wiring very efficiently by limiting the occurrence of error paths as much as possible.

It is a second object of the present invention to provide a method and an apparatus for circuit designing, whereby for the improvement of an arrangement or wiring, error paths are not simply improved but efficiently canceled by using certain indices for improvements.

The second object of the present invention is achieved by a circuit designing method, which comprises the steps of performing logical designing for a circuit to be designed, when wiring is performed among cells after the cells are arranged based on the result of this logical designing, performing path tracing from one or more tracing start pins for an arranging result or a wiring result, calculating a maximum value or a minimum value of an integrated delay value from one or more of the tracing start pins to each pin of the cells to be arranged through which a path passes during the path tracing, calculating degree of error importance according to a difference between a time for reaching each pin and a reference time for reaching the pin based on the maximum value or the minimum value of the integrated delay value, calculating degree of error contribution by integrating this degree of error importance for each pin and performing displaying in a display unit according to the degree of error contribution obtained for each pin.

In order to implement the circuit designing method described above, there is provided a circuit designing apparatus, which comprises a logical designing unit for performing logical designing for a circuit to be designed, an arranging unit for arranging cells based on the logical designing result of the logical designing unit, a wiring unit for performing wiring among the cells arranged by the arranging unit, a path tracing unit for performing path tracing from one or more tracing start pins for the arranging result of the arranging unit or the wiring result of the wiring unit, a delay value calculating unit for calculating a maximum value or a minimum value of an integrated delay value from one or more of the tracing start pins to each pin of the cells to be arranged through which a path passes during path tracing performed by this path tracing unit, an error importance calculating unit for calculating degree of error importance according to a difference between a time for reaching each pin and a reference time for reaching the pin based on the maximum value or the minimum value of the integrated delay value calculated by this delay calculating unit, an error contribution calculating unit for calculating degree of error contribution by integrating degree of error importance calculated by this error importance calculating unit for each pin, a display unit for displaying information necessary for circuit designing and a display control unit for controlling the displaying condition of the display unit according to the degree of error contribution for each pin calculated by the error contribution calculating unit.

With the circuit designing method and apparatus of the present invention, for the improvement of an arrangement or wiring, error paths are not simply improved, but rather the error paths can be canceled (corrected) extremely efficiently by performing path tracing after arranging or wiring so as to calculate degree of error contribution for each pin and using this degree of error contribution as an index for improvements.

It is a third object of the present invention to provide a method and an apparatus for circuit designing, whereby incorrect logical designing is checked at an early time and a period for circuit designing is shortened by reducing the number of designing steps.

The third object of the present invention is achieved by a circuit designing method, which comprises the steps of performing logical designing for a circuit to be designed, when wiring is performed among cells after the cells are arranged based on the result of this logical designing, calculating a maximum value or a minimum value of an integrated delay value from one or more tracing start pins to each pin of the cells to be arranged through which a path passes while performing path tracing with a unit delay value allocated to each of all the cells to be designed and 0 allocated as a delay value to each of all the nets among the cells after the logical designing, and calculating the number of gate stages among the sequential circuit cells or between input/output pins and the sequential circuit cells in the circuit to be designed based on the maximum value or the minimum value of the integrated delay value.

In order to implement the circuit designing method described above, there is provided a circuit designing apparatus, which comprises a logical designing unit for performing logical designing for a circuit to be designed, an arranging unit for arranging cells based on the logical designing result of this logical designing unit, a wiring unit for performing wiring among the cells arranged by this arranging unit, a path tracing unit for performing path tracing from one or more tracing start pins for the arranging result of the arranging unit or the wiring result of the wiring unit, a delay value calculating unit for calculating a maximum value or a minimum value of an integrated delay value from one or more of the tracing start pins to each pin of the cells to be arranged through which a path passes during path tracing performed by this path tracing unit, and a gate stage number calculating unit for calculating the number of gate stages among the sequential circuit cells or between input/output pins and the sequential circuit cells in the circuit to be designed by causing the delay value calculating unit to calculate a maximum value or a minimum value of an integrated delay value and then based on the maximum value or the minimum value of the integrated delay value while performing path tracing by the path tracing unit for the logical deigning result of the logical designing unit with a unit delay value allocated to each of all the cells to be designed and 0 allocated as a delay value to each of all the nets among the cells after the logical designing performed by the logical designing unit.

With the circuit designing method and apparatus of the present invention, since the minimum and maximum numbers of gate stages can be checked immediately after logical designing and incorrect logical designing can be checked at an early time, it is possible to discover a path which has a timing problem in a circuit to be designed in the initial designing stage of a LSI enlarged in size, and so on, at an early time. Accordingly, it is unnecessary to perform logical designing again after arranging or wiring, and it is possible to greatly shorten a period necessary for circuit designing by greatly reducing the number of designing steps.

It is a fourth object of the present invention to provide a method and an apparatus for circuit designing, whereby the number of designing steps is reduced and a period for circuit designing is shortened by minimum changing of packaging data so as to eliminate a timing error without performing logical designing again, even when degree of permissibility for changing an arrangement or wiring becomes extremely small.

The fourth object of the present invention is achieved by a circuit designing method, which comprises the steps of performing logical designing for a circuit to be designed, when wiring is performed among cells after the cells are arranged based on the result of this logical designing, calculating a maximum value or a minimum value of an integrated delay value from one or more tracing start pins to each pin of the cells to be arranged through which a path passes while performing path tracing from one or more of the tracing start pins for an arranging result or a wiring result, and displaying a maximum value or a minimum value of an integrated delay value for each pin, a path delay value between each input pin and each output pin in a gate arranged in between one or more of the tracing start pins and a target pin and having a plurality of input pins and a net delay value among the cells in a display unit together with a worst path in which an integrated delay value to the target pin is maximum or minimum.

The fourth object is achieved by another circuit designing method of the present invention, which comprises the steps of performing logical designing for a circuit to be designed, when wiring is performed among cells after the cells are arranged based on the result of this logical designing, calculating a maximum value or minimum value of an integrated delay value from one or more tracing start pins to each pin of the cells to be arranged through which a path passes while performing path tracing from one or more of the tracing start pins for an arranging result or a wiring result, performing a timing check for the arranging result or the wiring result based on the maximum value or the minimum value of the integrated delay value, and if the result of the timing check shows that a worst path in which an integrated delay value to a target pin is maximum or minimum does not satisfy a specified timing condition, replacing the input pin of the worst path by another input pin in at least one of gates having a plurality of input pins so as to cause all paths reaching the target pin to satisfy the timing condition based on the maximum value or the minimum value of an integrated delay value for each pin, a path delay value between each input pin and each output pin in the gates arranged in between one or more of the tracing start pins and the target pin and having the plurality of input pins and a net delay value among the cells.

In order to implement the former circuit designing method described above, there is provided a circuit designing apparatus, which comprises a logical designing unit for performing logical designing for a circuit to be designed, an arranging unit for arranging cells based on the logical designing result of this logical designing unit, a wiring part for performing wiring among the cells arranged by this arranging unit, a path tracing unit for performing path tracing from one or more tracing start pins for the arranging result of the arranging unit or the wiring result of the wiring unit, a delay value calculating unit for calculating a maximum value or a minimum value of an integrated delay value from one or more of the tracing start pins to each pin of the cells to be arranged through which a path passes during path tracing performed by this path tracing unit, a display unit for displaying information necessary for circuit designing, and a display control unit for controlling the displaying condition of this display unit. In the circuit designing apparatus thus constructed, the display control unit controls the displaying condition of the display unit in such a manner that the display unit displays a maximum value or a minimum value of an integrated delay value for each pin calculated by the delay value calculating unit, a path delay value between each input pin and each output pin in a gate arranged in between one or more of the tracing start pins and a target pin and having a plurality of input pins and a net delay value among the cells together with a worst path in which an integrated delay value to the target pin is maximum or minimum.

In order to implement the latter circuit designing method described above, there is provided a circuit designing apparatus, which comprises, in addition to a logical designing unit, an arranging unit, a wiring unit, a path tracing unit and a delay value calculating unit as in the case of the apparatus described above, a timing check unit for performing a timing check for the arranging result of the arranging unit or the wiring result of the wiring unit based on the maximum value or the minimum value of an integrated delay value calculated by the delay value calculating unit, and an input pin switching unit for replacing the input pin of a worst path by the input pin of another path in at least one of gates having a plurality of input pins based on the maximum value or the minimum value of an integrated delay value calculated by the delay value calculating unit for each pin, a path delay value between each input pin and each output pin in the gates arranged in between one or more tracing start pins and a target pin and having the plurality of input pins and a net delay value among cells in such a manner that all paths reaching the target pin satisfy a specified timing condition, if the result of checking performed by the timing check unit shows that the worst path in which an integrated delay value to the target pin is maximum or minimum does not satisfy the timing condition.

With the circuit designing method and apparatus of the present invention, since a timing error can be eliminated (corrected) extremely easily by minimum changing of packaging data, that is, by switching among the input pins, without performing logical designing again even when degree of permissibility for changing an arrangement or wiring becomes very small, it is possible to reduce the number of designing steps and thus greatly shorten a period for circuit designing.

BRIEF DESCRIPTION OF THE DRAWINGS

These and other objects, features and advantages of the present invention will become apparent upon reading of the following detailed description and drawings, in which.

DESCRIPTION OF THE PREFERRED EMBODIMENTS

[A] Aspects of the Invention

According to a circuit designing method of the present invention, logical designing is performed for a circuit to be designed, and when wiring is to be performed among cells which have been arranged based on the result of this logical designing, path tracing is performed from one or more tracing start pins for the logical designing result, and then the number of passing through each pin of the cells to be arranged is counted during this path tracing.

In this case, the cells may be arranged according to a priority order based on the number of passing counted for each pin. Alternatively, wiring may be performed among the cells according to the priority order based on the number of passing counted for each pin. During arranging of the cells, a display unit may perform displaying according to the priority order based on the number of passing counted for each pin. Also, during performing of wiring among the cells, the display unit may perform displaying according to the priority order based on the number of passing counted for each pin.

Figure 1:
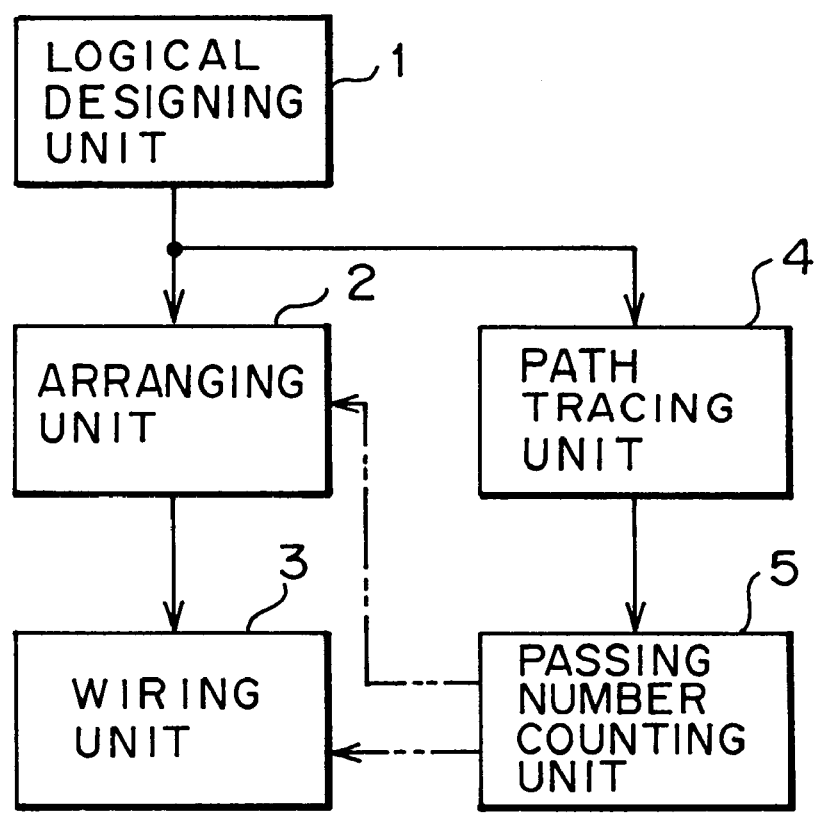
FIGS. 1 to 5 are block diagrams illustrating different aspects of the present invention respectively.

Referring first to FIG. 1, which is a principle block diagram, there is shown a circuit designing apparatus according to an aspect of the present invention. This circuit designing apparatus is intended to implement the circuit designing method of the present invention described above. The circuit designing apparatus includes a logical designing unit 1 for performing logical designing for a circuit to be designed, an arranging unit 2 for arranging cells based on the result of logical designing performed by this logical designing unit 1, a wiring unit 3 for performing wiring among the cells arranged by this arranging unit 2, a path tracing unit 4 for performing path tracing from one or more tracing start pins for the logical designing result of the logical designing unit 1, and a passing number counting unit 5 for counting the number of passing through each pin of the cells to be arranged during path tracing performed by this path tracing unit 4.

The arranging part 2 arranges the cells according to a priority order based on a counting result by the passing number counting unit 5. The wiring unit 3 performs wiring among the cells according to the priority order based on the counting result by the passing number counting unit 5.

The circuit designing apparatus further includes a display unit for displaying information which is necessary for circuit designing, and a display control unit for controlling the displaying condition of this display unit. The display control unit may control the displaying condition of the display unit according to the priority order based on the counting result by the passing number counting unit 5 during arranging of the cells by the arranging unit 2. Alternatively, the display control unit may control the displaying condition of the display unit according to the priority order based on the counting result by the passing number counting part 5 during wiring among the cells performed by the wiring unit 3.

With the circuit designing apparatus thus constructed, the number of passing through each pin (static signal propagating density) is calculated by performing path tracing after logical designing, and this passing number can be used as an index for arranging or wiring. Accordingly, arranging or wiring can be performed very efficiently by restricting the occurrence of error paths as much as possible. Moreover, even if it is difficult to reduce critical paths and perform a timing improvement during arranging or wiring in the latter period of designing, the timing improvement can be performed extremely easily by giving a higher processing priority to a cell which has a high path passing number when arranging or wiring is to be performed. This easy timing improvement contributes a great deal toward the improvement of designing quality.

According to a circuit designing method of the present invention, logical designing is performed for a circuit to be designed, when wiring is to be performed among cells which have been arranged based on the result of this logical designing, the maximum value or the minimum value of an integrated delay value from one or more tracing start pins to each pin of the cells to be arranged through which a path has passed is calculated while performing path tracing from one or more of the tracing start pins for an arranging result or a wiring result, degree of error importance is calculated according to a difference between a time for reaching each pin and a reference time for reaching the pin based on the maximum value or the minimum value of the integrated delay value, degree of error contribution is calculated by integrating the degree of error importance for each pin, and displaying is performed by a display unit according to the degree of error contribution obtained for each pin.

Figure 2:
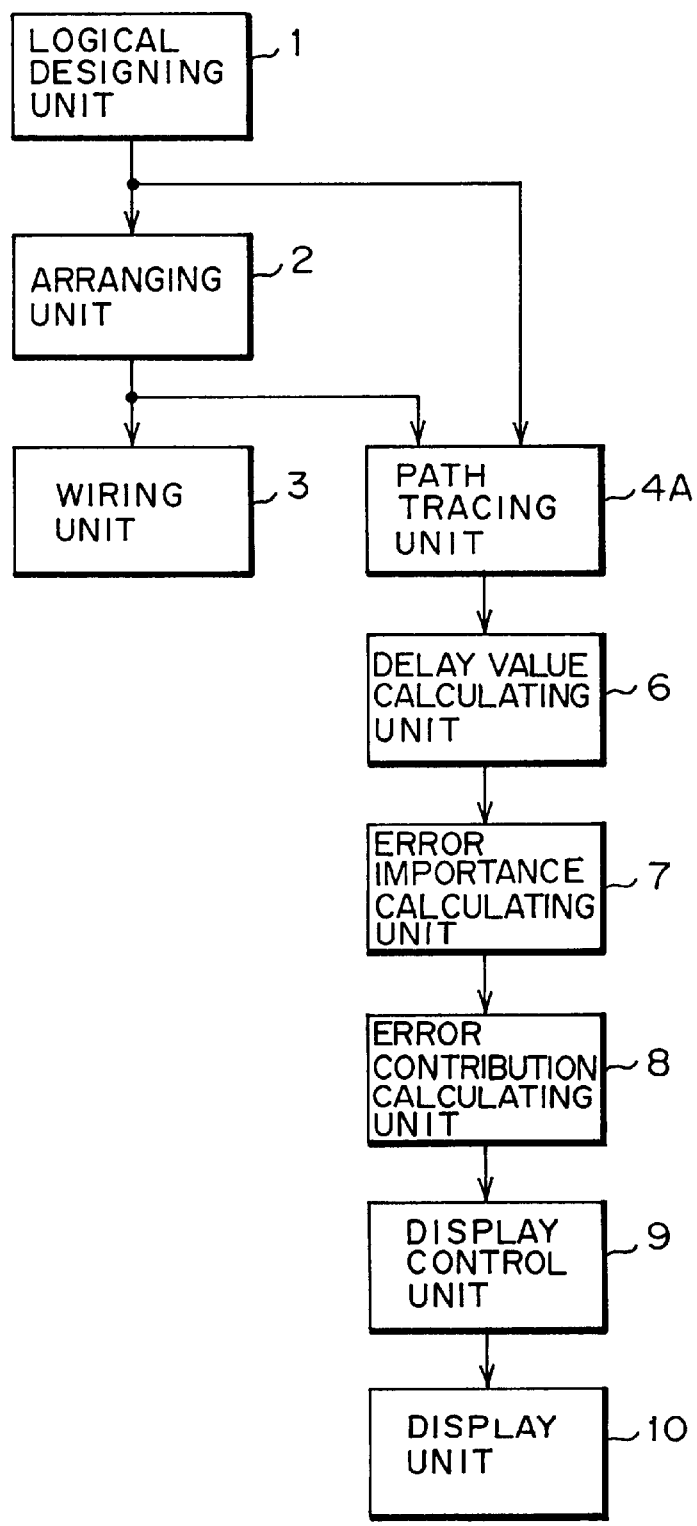

Referring now to FIG. 2 which is a principle block diagram, there is shown a circuit designing apparatus according to another aspect of the present invention. This circuit designing apparatus is intended to implement the circuit designing method of the present invention described above. In addition to a logical designing unit 1, an arranging unit 2 and a wiring unit 3 similar to those in the apparatus described above, the circuit designing apparatus includes a path tracing unit 4A for performing path tracing from one or more tracing start pins for an arranging result by the arranging unit 2 or a wiring result by the wiring unit 3, a delay value calculating unit 6 for calculating the maximum value or the minimum value of an integrated delay value from one or more of the tracing start pins to each pin of the cells to be arranged through which a path has passed during path tracing performed by this path tracing unit 4A, an error importance calculating unit 7 for calculating degree of error importance according to a difference between a time for reaching each pin and a reference time for reaching the pin based on the maximum value or the minimum value of the integrated delay value calculated by this delay value calculating unit 6, an error contribution calculating unit 8 for calculating degree of error contribution by integrating the degree of error importance calculated by this error importance calculating unit 7 for each pin, a display unit 9 for displaying information necessary for circuit designing, and a display control unit 10 for controlling the displaying condition of the display part 9 according to the degree of error contribution calculated by the error contribution calculating unit 8 for each pin.

With the circuit designing apparatus thus constructed, when arranging or wiring is to be performed, instead of a simple improvement of an error path, path tracing is performed after arranging or wiring and degree of error contribution is calculated for each pin, and this degree of error contribution can be used as an index for improvements. Accordingly, an error path can be canceled (corrected) very efficiently.

According to a circuit designing method of the present invention, logical designing is performed for a circuit to be designed, when wiring is to be performed among cells which have been arranged based on the result of this logical designing, the maximum value or the minimum value of an integrated delay value from one or more tracing start pins to each pin of the cells to be arranged through which a path has passed is calculated while performing path tracing with a unit delay value allocated to each of all the cells to be designed and 0 allocated as a delay value to each of all the nets among the cells after the logical designing, and the number of gate stages among the sequential circuit cells or between input/output pins and the sequential circuit cells in the circuit to be designed.

In this case, the number of gate stages may be checked by comparing the gate stage number with the prescribed number of gate stages. Alternatively, displaying may be performed by the display unit according to the number of gate stages. Otherwise, the result of checking the number of gate stages may be displayed in the display unit.

Figure 3:
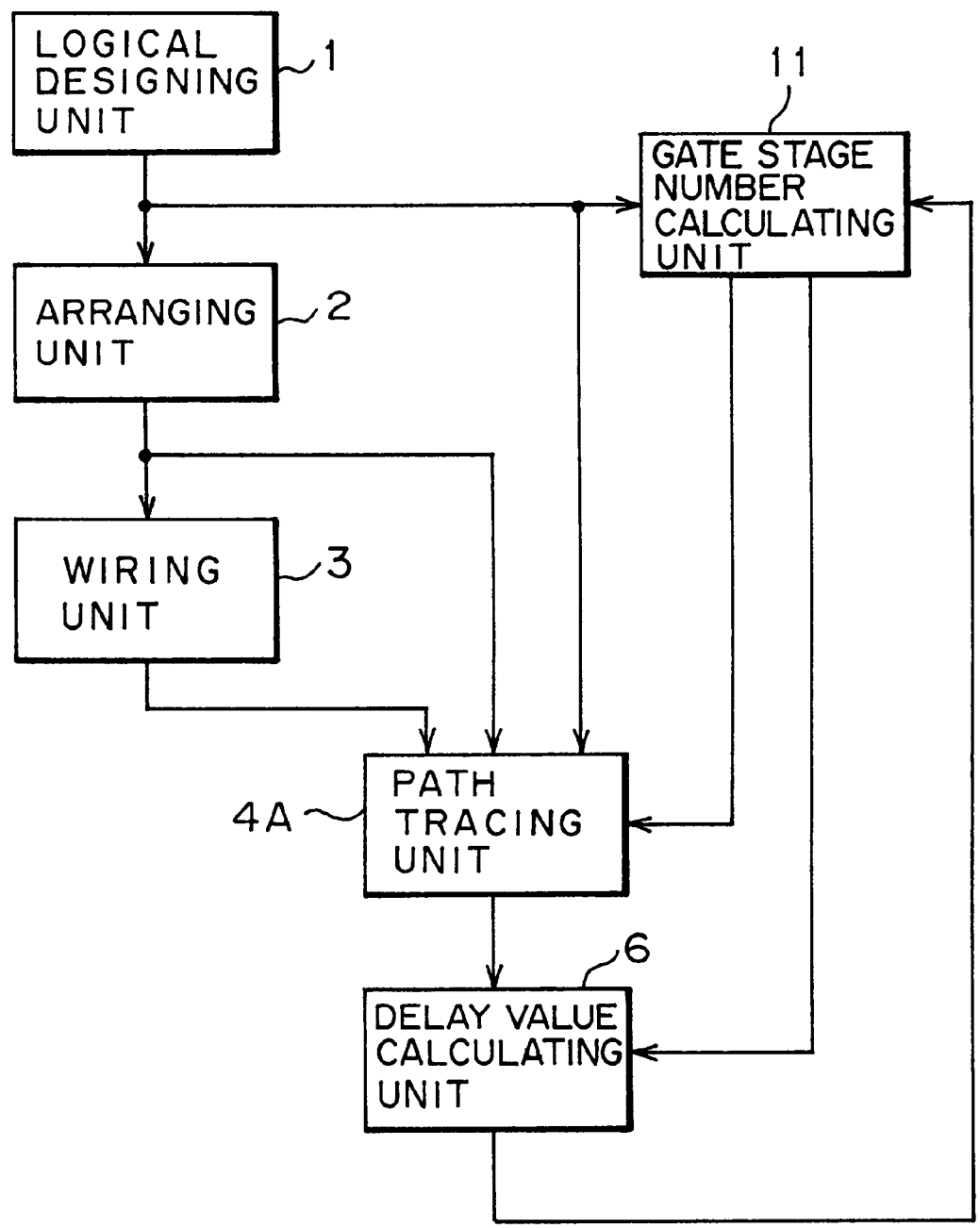

Referring now to FIG. 3 which is a principle block diagram, there is shown a circuit designing apparatus according to still another aspect of the present invention. This circuit designing apparatus is intended to implement the circuit designing method of the present invention described above. In addition to a logical designing unit 1, an arranging unit 2, a wiring unit 3, a path tracing unit 4A and a delay value calculating unit 6 similar to those in the apparatus described above, the circuit designing apparatus includes a gate stage number calculating unit 11. This gate stage number calculating unit 11 causes the delay value calculating unit 6 to calculate the maximum value or the minimum value of an integrated delay value while performing path tracing by the path tracing unit 4A for a logical designing result by the logical designing unit 1 with a unit delay value allocated to each of all cells to be designed and 0 allocated as a delay value to all nets among the cells after the logical designing performed by the logical designing unit. The gate stage number calculating unit 11 then calculates the number of gate stages among the sequential circuit cells or between input/output pins and the sequential circuit cells in a circuit to be designed based on the maximum value or the minimum value of the integrated delay value.

In this case, there may be provided a gate stage number checking unit, which checks the number of gate stages by comparing a gate stage number calculated by the gate stage number calculating unit 11 with a prescribed gate stage number. Alternatively, there may be provided a display unit for displaying information necessary for circuit designing and a display control unit for controlling the displaying condition of this display unit. This display control unit may control the displaying condition of the display unit according to the gate stage number calculated by the gate stage calculating unit 11. Alternatively, the display control unit may control the displaying condition of the display unit in such a manner that the display unit displays a checking result by the gate stage number checking unit.

With the circuit designing apparatus thus constructed, since checking can be performed for minimum and maximum gate stage numbers immediately after logical designing and incorrect logical designing can be checked at an early time, it is possible to discover a path which has a timing problem in circuit designing at an early stage during the initial designing period of a LSI enlarged in size, and so on. Accordingly, it is unnecessary to perform logical designing again after arranging or wiring and it is possible to greatly shorten a period necessary for circuit designing by greatly reducing the number of designing steps.

According to a circuit designing method of the present invention, logical designing is performed for a circuit to be designed, when wiring is to be performed among cells which have been arranged based on the result of this logical designing, the maximum value or the minimum value of an integrated delay value from one or more tracing start pins to each pin of the cells to be arranged through which a path has passed is calculated while performing path tracing from one or more of the tracing start pins for an arranging result or a wiring result, and the maximum value or the minimum value of an integrated delay value for each pin, a path delay value between each input pin and each output pin in a gate arranged in between one or more of the tracing start pins and a target pin and having a plurality of input pins and a net delay value among the cells are displayed in a display unit together with a worst path in which an integrated delay value to the target pin is maximum or minimum.

Figure 4:
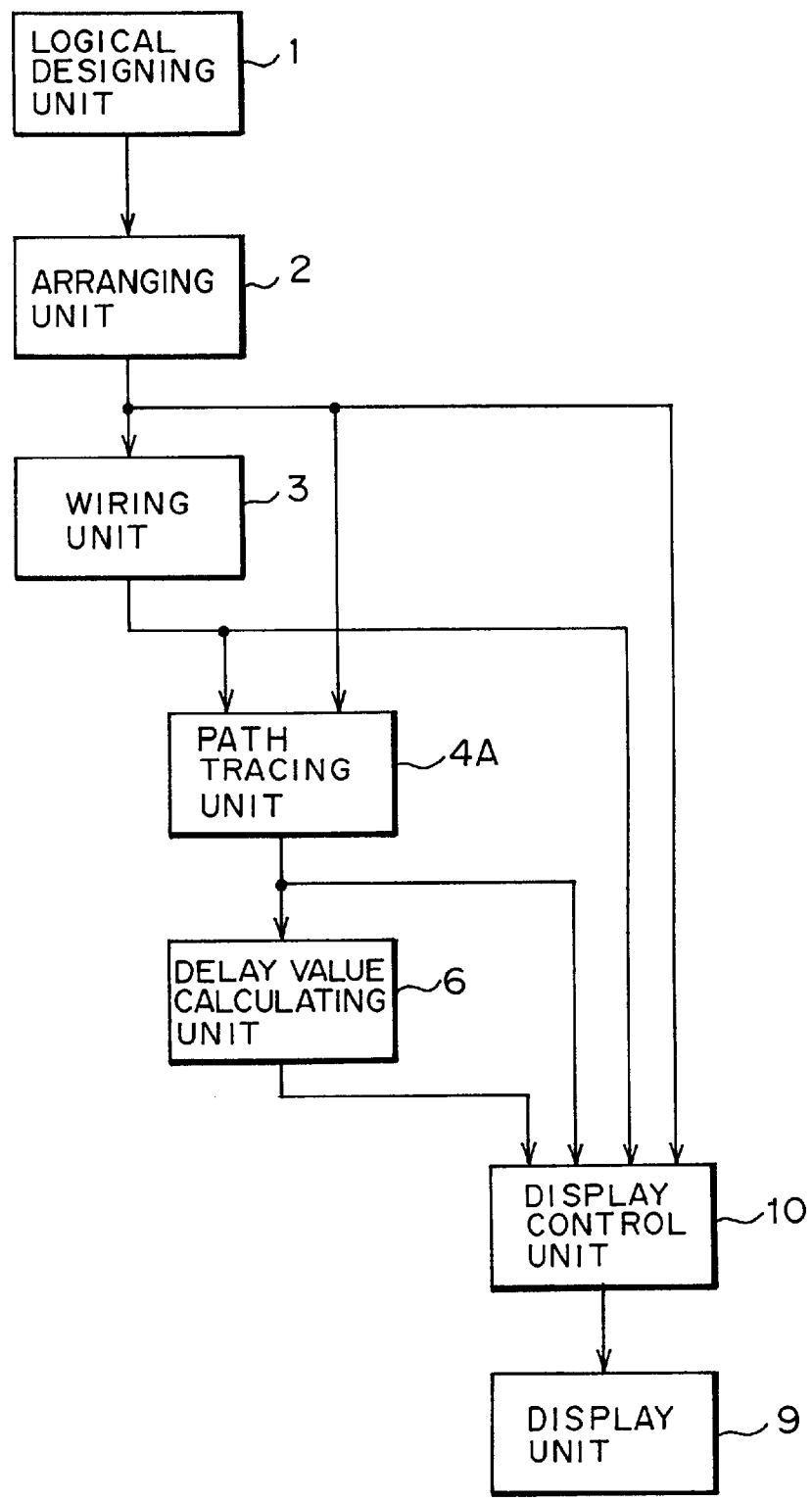

Referring now to FIG. 4 which is a principle block diagram, there is shown a circuit designing apparatus according to a further aspect of the present invention. This circuit designing apparatus is intended to implement the circuit designing method of the present invention described above. As in the case of the apparatus described above, the circuit designing apparatus includes a logical designing unit 1, an arranging unit 2, a wiring unit 3, a path tracing unit 4A, a delay value calculating unit 6, a display unit 9 and a display control unit 10. In this case, however, the display control unit 10 controls the displaying condition of the display unit 9 in such a manner that the display unit 9 displays the maximum value or the minimum value of an integrated delay value for each pin calculated by the delay value calculating unit 6, a path delay value between each input pin and each output pin in a gate arranged in between one or more tracing start pins and a target pin and having a plurality of input pins and a net delay value among cells together with a worst path in which an integrated delay value to the target pin is maximum or minimum.

With the circuit designing apparatus thus constructed, even when degree of permissibility for changing an arrangement or wiring becomes extremely small, information regarding switching among the input pins which enables elimination of a timing error is displayed to a designer, and so on, and thus the timing error can be eliminated based on judgment made by the designer, and so on, without performing logical designing again. Accordingly, it is possible to greatly shorten a period for circuit designing by reducing the number of designing steps.

According to a circuit designing method of the present invention, logical designing is performed for a circuit to be designed, when wiring is to be performed among cells which have been arranged based on the result of this logical designing, the maximum value or the minimum value of an integrated delay value from one or more tracing start pins to each pin of the cells to be arranged through which a path has passed is calculated while performing path tracing from one or more of the tracing start pins for an arranging result or a wiring result, a timing check is performed for the arranging result or the wiring result based on the maximum value or the minimum value of the integrated delay value, and if the result of the timing check shows that a worst path in which an integrated delay value to a target pin is maximum or minimum does not satisfy a specified timing condition, an input pin of the worst path is replaced by an input pin of another path in at least one of gates having a plurality of input pins based on the maximum value or the minimum value of an integrated delay value for each pin, a path delay value between each input pin and each output pin in the gates arranged in between one or more of the tracing start pins and the target pin and having the plurality of input pins and a net delay value among the cells in such a manner that all paths reaching the target pin satisfy the timing condition.

Figure 5:
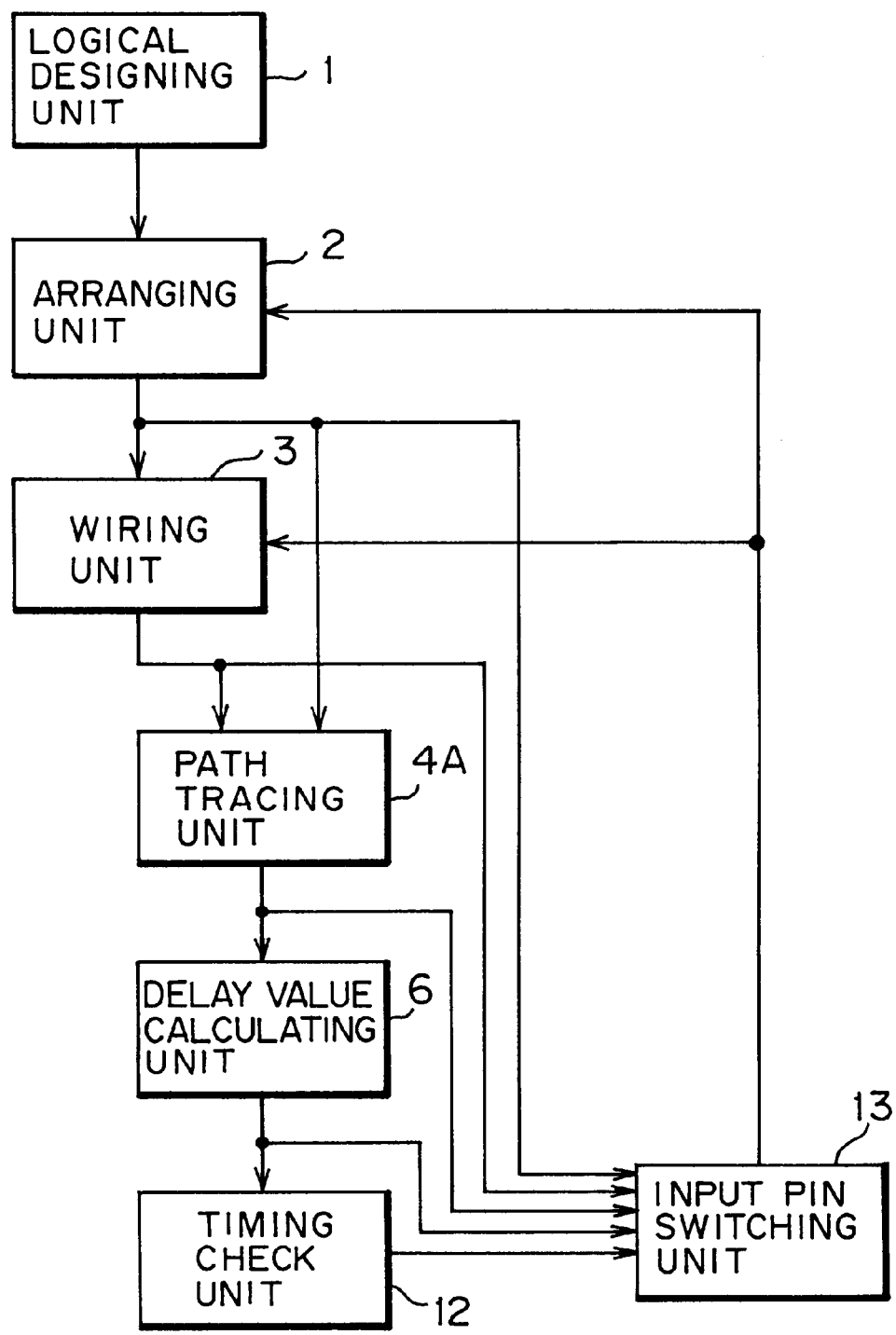

Referring now to FIG. 5 which is a principle block diagram, there is shown a circuit designing apparatus according to a still further aspect of the present invention.

This circuit designing apparatus is intended to implement the circuit designing method of the present invention described above. In addition to a logical designing unit 1, an arranging unit 2, a wiring unit 3, a path tracing unit 4A and a delay value calculating unit 6 similar to those in the apparatus described above, the circuit designing unit includes a timing check unit 12 and an input pin switching unit 13.

The timing check unit 12 performs a timing check for an arranging result by the arranging unit 2 or a wiring result by the wiring unit 3 based on the maximum value or the minimum value of an integrated delay value calculated by the delay value calculating unit 6.

The input pin switching unit 13 is used, if a checking result by the timing check unit 12 shows that a worst path in which an integrated delay value to a target pin is maximum or minimum does not satisfy a specified timing condition, for replacing an input pin of the worst path by an input pin of another path in at least one of gates having a plurality of input pins based on the maximum value or the minimum value of an integrated delay value for each pin calculated by the delay value calculating unit 6, a path delay value between each input pin and each output pin in the gates arranged in between one or more tracing start pins to the target pin and having the plurality of input pins and a net delay value among cells in such a manner that all paths reaching the target pin satisfy the timing condition.

With the circuit designing apparatus thus constructed, even when degree of permissibility for changing an arrangement or wiring becomes extremely small, minimum changing of packaging data, that is, switching among the input pins, is automatically performed, and thus a timing error can be eliminated (corrected) without performing logical designing again. Accordingly, it is possible to greatly shorten a period for circuit designing by reducing the number of designing steps.

[B] Embodiments of the Invention

The preferred embodiments of the present invention will be described below with reference to the accompanying drawings.

Figure 6:
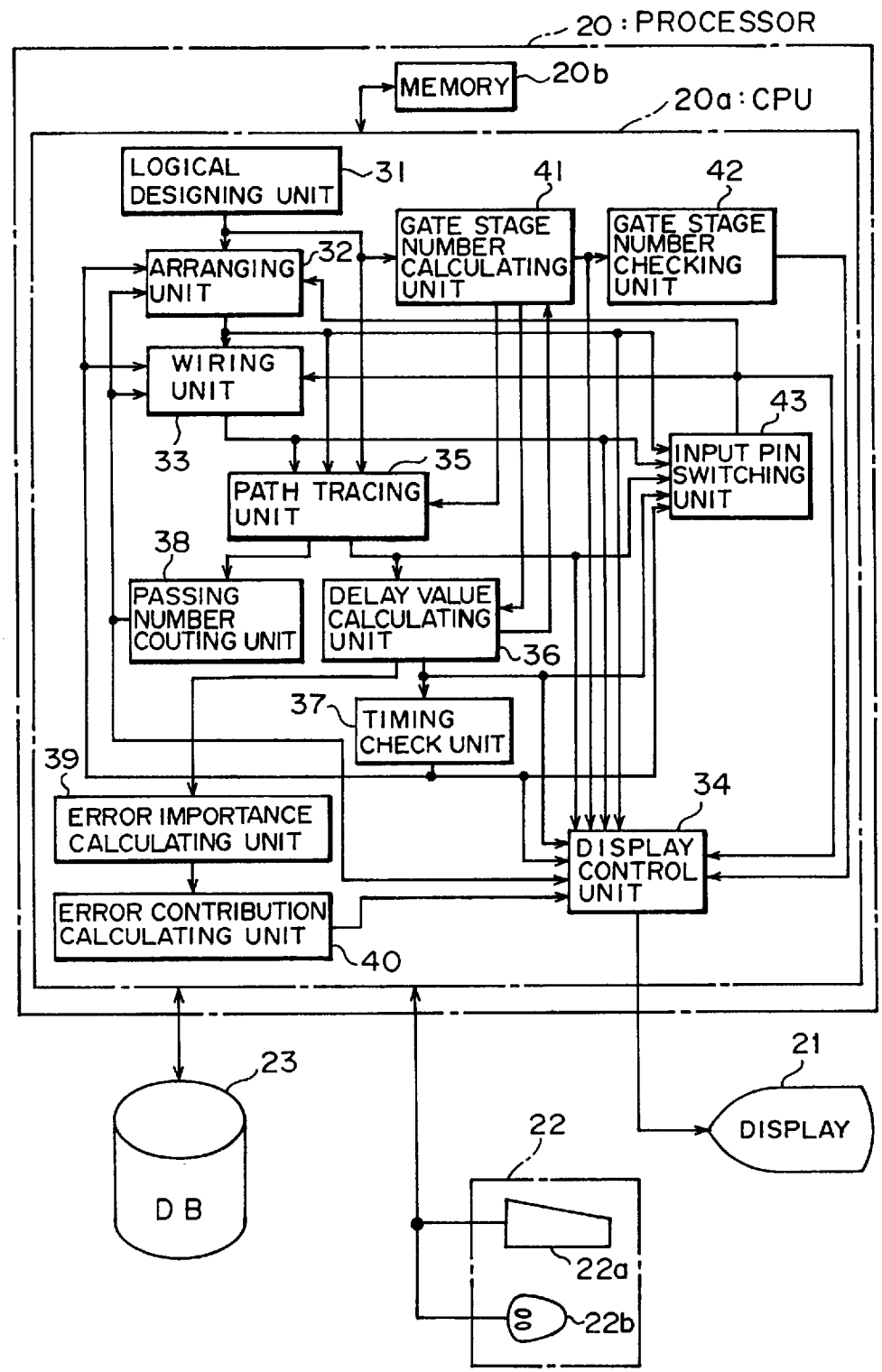
FIG. 6 is a block diagram showing a functional construction of a circuit designing apparatus of an embodiment of the present invention.

Referring first to FIG. 6 which is a block diagram, there is shown a functional construction of a circuit designing apparatus of an embodiment of the present invention. As shown in the drawing, a processor 20 provided with a display (display unit) 21, an input unit 22, a keyboard 22a and a mouse 22b functions as the circuit designing apparatus of the embodiment.

The display 21 displays information necessary for circuit designing performed by the processor 20 and the progress of its circuit designing. The keyboard 22a and the mouse 22b are operated by a designer (operator) and used for inputting various bits of information regarding circuit designing. Accordingly, the designer can perform circuit designing (including logical designing, arranging and wiring) in an interactive manner by inputting various bits of information through the keyboard 22a and the mouse 22b while referring to a display made by the display 21.

The processor 20 is composed of a CPU 20a and a memory 20b. The CPU 20a performs circuit designing based on programs and various data stored in the memory 20b. The progress of circuit designing performed by this CPU 20a is displayed on the display 21 through a display control unit 34, as described later, on occasion. Information inputted through the keyboard 22a and the mouse 22b is inputted to the CPU 20a and used for circuit designing. The memory 20b functions as a work memory when circuit designing is to be performed by the CPU 20a, and holds table data, and so on, for each pin like that described later by referring to FIG. 9.

A data base 23 is connected to the processor 20. In this data base 23, there is stored beforehand information (e.g., delay value information) regarding cells (FFs or various gates) mounted in a circuit to be designed.

The functional construction of the circuit designing apparatus of the embodiment which is realized by the CPU 20a in the above-noted processor 20 will be described by referring to FIG. 6. As shown in FIG. 4, the circuit element arranging apparatus of the embodiment, that is, the CPU 20a, is composed of a logical designing unit 31, an arranging unit 32, a wiring unit 33, a display control unit 34, a path tracing unit 35, a delay value calculating unit 36, a timing check unit 37, a passing number counting unit 38, an error importance calculating unit 39, an error contribution calculating unit 40, a gate stage number calculating unit 41, a gate stage number checking unit 42 and an input pin switching unit 43.

The logical designing unit 31 performs logical designing for a circuit to be designed (e.g., LSI). The arranging unit 32 arranges cells (FFs or various gates) based on a logical designing result by the logical designing unit 31. The wiring unit 33 performs wiring among the cells arranged by the arranging unit 32.

The display control unit 34 controls the displaying condition of the display 21 as described later.

The path tracing unit 35 performs path tracing from one or more tracing start pins for a logical designing result by the logical designing unit 31, an arranging result by the arranging unit 32 or a wiring result by the wiring unit 33 as described later by referring to FIGS. 8(*a*) and 8(*b*).

Figure 9:
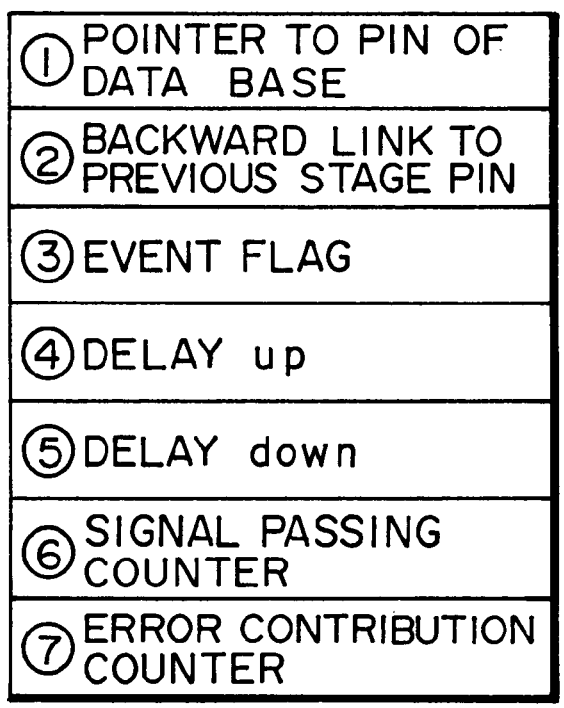
FIG. 9 is a view showing a content of a table provided for each pin for holding path tracing data regarding each pin in the embodiment.

The delay value calculating unit 36 calculates the maximum value or the minimum value of an integrated delay value from one or more of the tracing start pins to each pin of the cells to be arranged, through which a path has passed, according to a flowchart (described later) shown in FIG. 10 during path tracing performed by the path tracing unit 35. For calculation of the maximum value or the minimum value of an integrated delay value, a table (described later) provided for each pin and shown in FIG. 9 is used. Delay value information for each pin, and so on, necessary for calculation of a delay value is read from the data base 23.

The timing check unit 37 performs a timing check for an arranging result by the arranging unit 32 or a wiring result by the wiring unit 33 based on the maximum value or the minimum value of the integrated delay value calculated by the delay value calculating unit 36. In other words, the timing check unit 37 is used for detecting the occurrence of an error path which does not satisfy a timing condition.

The passing number counting unit 38 counts the number of passing through each pin of the cells to be arranged according to a flowchart (described later) shown in FIG. 11 during path tracing performed by the path tracing unit 35 after logical designing. For counting of a path passing number, the table (signal passing counter, described later) provided for each pin and shown in FIG. 9 is used. In the embodiment, the arranging unit 32 arranges the cells according to a priority order based on a counting result by the passing number counting unit 38. The wiring unit 33 performs wiring among the cells according to the priority order based on the counting result by the passing number counting unit 38.

The error importance calculating unit 39 calculates degree of error importance according to a difference between a time for reaching each pin and a reference time for reaching the pin by means of an expression, later described, based on the maximum value or the minimum value of an integrated delay value calculated by the delay value calculating unit 36, when the maximum value or the minimum value of the integrated delay value for each pin is to be calculated by the delay value calculating unit 36 while performing path tracing by the path tracing unit 35 for an arranging result by the arranging unit 32 or a wiring result by the wiring unit 33.

The error contribution calculating unit 40 calculates degree of error contribution by integrating the degree of error importance calculated by the error importance calculating unit 39 for each pin. For error contribution calculation, the table (error contribution counter, later described) provided for each pin and shown in FIG. 9 is used.

The gate stage number calculating unit 41 operates in such a manner that after logical designing performed by the logical designing unit 31, with a unit delay value allocated to each of all the cells to be designed and 0 allocated as a delay value to each of all the nets among the cells, according to the flowchart shown in FIG. 10 (described later), the delay value calculating unit 36 is caused to calculate the maximum value or the minimum value of an integrated delay value while performing path tracing by the path tracing unit 35 for the logical designing result of the logical designing unit 31 and then the number of gate stages among FFs (sequential circuit cells) in a circuit to be designed or between the input/output pins and the FFs is calculated based on the maximum value or the minimum value of the integrated delay value.

The gate stage number checking unit 42 checks the number of gate stages by comparing a gate stage number calculated by the gate stage number calculating unit 41 with a prescribed gate stage number.

The input pin switching unit 43 is operated when the result of checking performed by the timing check unit 37 shows that a worst path in which an integrated delay value to a target pin is maximum or a minimum does not satisfy a specified timing condition. Specifically, the input pin switching unit 43 replaces the input pin of the worst path with the input pin of another path in at least one of gates having a plurality of input pins (multi-input gate) based on the maximum value or the minimum value of the integrated delay value for each pin calculated by the delay value calculating unit 36, a path delay value between each input pin and each output pin in the gates arranged in between one or more of the tracing start pins to a target pin and having the plurality of input pins and a net delay value among the cells such that all paths reaching the target pin satisfy the timing condition. A switching operation between the input pins performed by this input pin switching unit 43 will be described in detail later by referring to FIG. 13. Information regarding a path delay value or a net delay value can be read from the data base 23.

The display control unit 34 of the embodiment has display control functions ① to ⑥ described below.

① A function for controlling the displaying condition of the display 21 according to a priority order, which is based on a counting result by the passing number counting unit 38, when the cells are to be arranged by the arranging unit 32. For example, a list of the cells to be preferentially arranged is sorted and displayed according to a passing number (that is, a priority order for arranging). Also, the cells to be preferentially arranged are displayed with emphasis by changing display colors.

② A function for controlling the displaying condition of the display 21 according to a priority order, which is based on a counting result by the passing number counting unit 38, when wiring is to be performed among the cells by the wiring unit 33. For example, a list of the cells or the nets among which wiring is to be preferentially set is sorted and displayed according to a passing number (that is, a priority order for wiring). Also, the cells or the nets among which wiring is to be preferentially set are displayed with emphasis by changing display colors.

③ A function for controlling the displaying condition of the display 21 according to degree of error contribution for each pin, which is calculated by the error contribution calculating unit 40, when an arrangement made by the arranging unit 32 or wiring performed by the wiring unit 33 is to be improved after the occurrence of an error path is detected by the timing check unit 37. For example, a list of pins having high degree of error contribution is sorted and displayed in order of error contribution levels. Also, the pins having high degree of error contribution, that is, first in a priority order for improving, or the nets accompanying these pins, are displayed with emphasis by changing display colors.

④ A function for controlling the displaying condition of the display 21 according to the number of gate stages, which is calculated by the gate stage number calculating unit 41. For example, calculated gate stage numbers are sorted and displayed in a list or in a graph.

⑤ A function for controlling the displaying condition of the display 21 such that a checking result by the gate stage number checking unit 42 is displayed on the display 21. For example, a list of violating paths, that is, paths which have gate stages less than the prescribed level in number or multi-stage paths which have gate stages exceeding the prescribed level in number, is sorted and displayed in order of the gate stage numbers.

Figure 12:
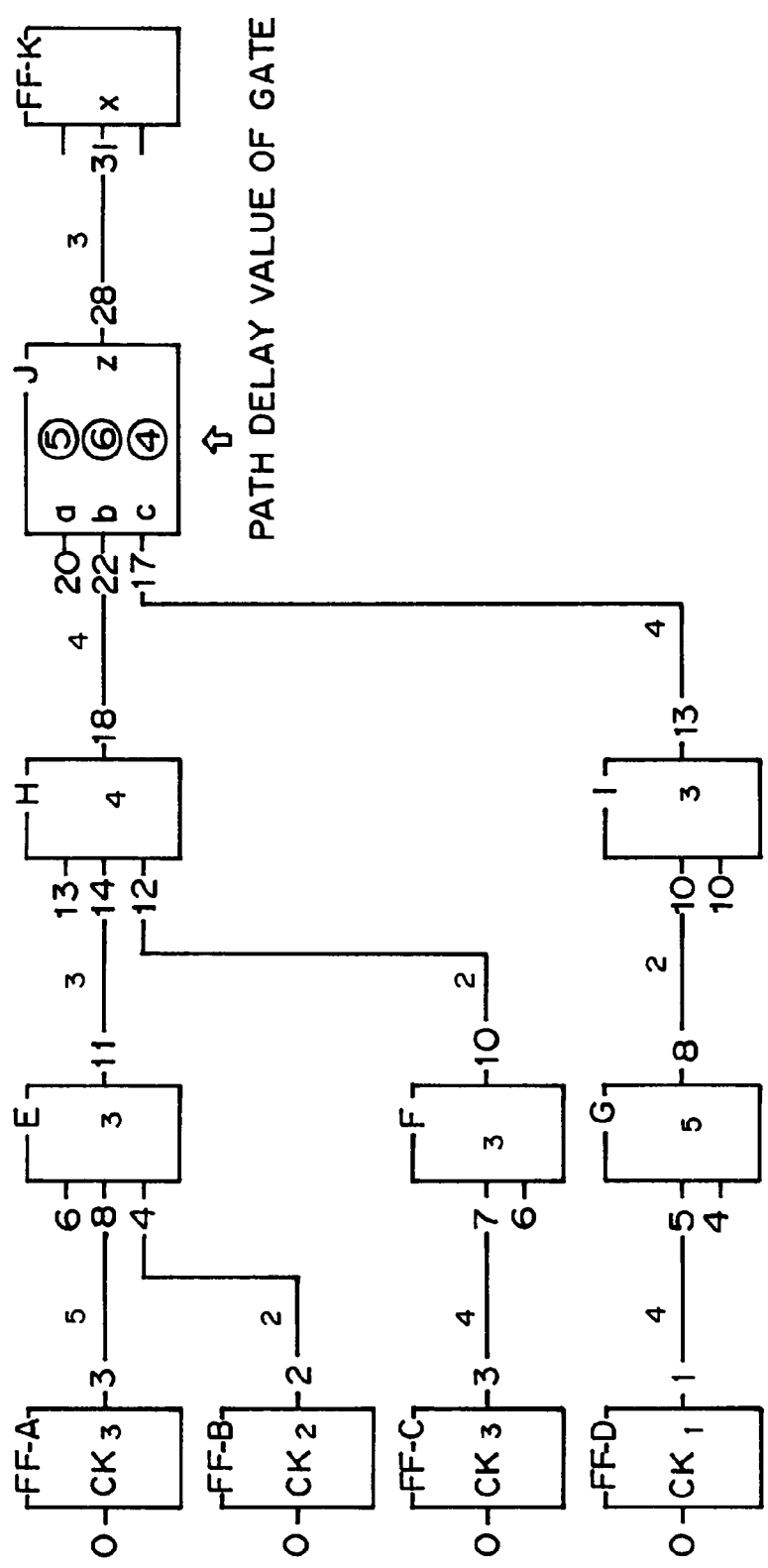
FIG. 12 is a view showing a display example which enables switching among input pins in the embodiment.

⑥ A function for controlling the displaying condition of the display 21 such that the maximum value or the minimum value of an integrated delay value for each pin, which is calculated by the delay value calculating unit 36, a path delay value between each input pin and each output pin in a multi-input gate, which is arranged in between one or more of the tracing start pins to a target pin, and a net delay value among the cells are displayed on the display 21 together with a worst pin in which an integrated delay value to the target pin is maximum or minimum. Information regarding a path delay value or a net delay value is read from the data base 23. A display example for this case is shown in FIG. 12 (described later).

Figure 7:
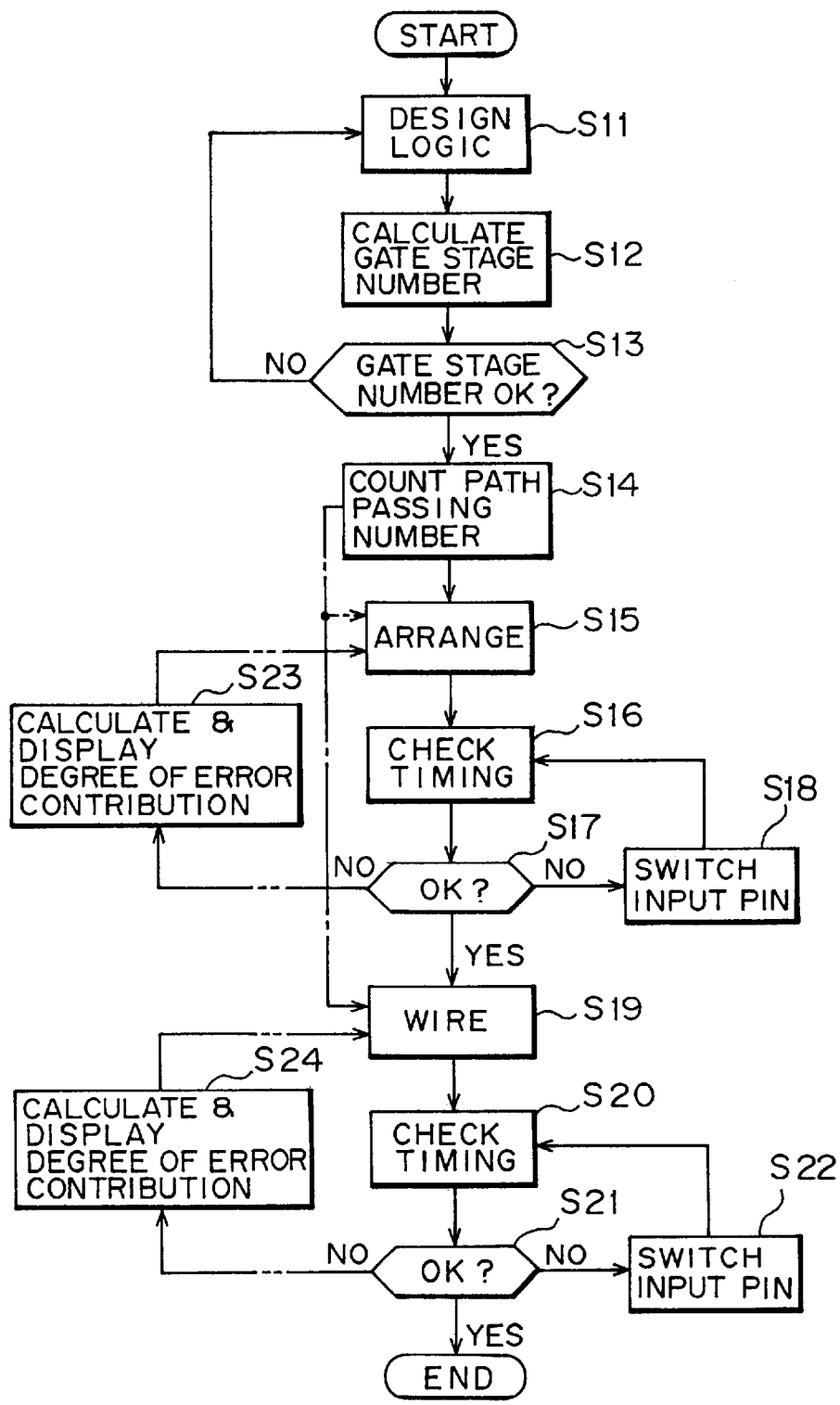
FIG. 7 is a flowchart illustrating a basic operation of the circuit designing apparatus of the embodiment.

Next, the basic operation of the circuit designing apparatus of the embodiment constructed in the manner described above will be described in brief by referring to the flowchart shown in FIG. 7 (steps S11 to S24).

First, logical designing is performed for a circuit to be designed (e.g., LSI) by the logical designing unit 31 based on logical synthesis (step S11). After this operation, the number of gate stages among FFs or between the input/output pins and FFs is calculated by the gate stage number calculating unit 41 (step S12). Then, the calculated number of gate stages is checked by the gate stage number checking unit 42 (step S13).

Then, with a unit delay value allocated to each of all the cells to be designed and 0 allocated as a delay value to each of all the nets among the cells, according to the flowchart shown in FIG. 10 (described later), the maximum value or the minimum value of an integrated delay value is calculated by the delay value calculating unit 36 while performing path tracing for the logical designing result of the logical designing unit 31 by the path tracing part 35. Then, based on the calculated maximum value or the minimum value of the integrated delay value, the number of gate stages among FFs or between the input/output pins and FFs in the circuit to be designed is calculated by the gate stage number calculating unit 41.

Thereafter, if the existence of violating paths (paths which do not reach the prescribed number for gate stages or multi-stage paths which exceed the prescribed number) is determined by the gate stage number checking unit 42 (NO determination is made in step S13), the process returns to step S11 and logical designing is performed again.

If no violating paths exist (YES determination is made in step S13), a path passing number (signal passing number) is counted by the passing number counting unit 38 (step S14). That is, according to the flowchart shown in FIG. 11 (described later), path tracing is performed by the path tracing unit 35 after logical designing, the number of passing (signal passing number) through each pin of the cells to be arranged is counted and this counted number is then held in the signal passing counter of a table for each pin (see FIG. 9).

Then, arranging of the cells (FFs or various gates) is performed by the arranging unit 32 based on the result of logical designing (step S15). The cells are arranged according to a priority order based on the signal passing number which has been counted in step S14.

After arranging, according to the flowchart shown in FIG. 10 (described later), a delay value for each pin in the arranging result is calculated by the delay value calculating part 36 while performing path tracing by the path tracing unit 35 for the arranging result. At this time, however, wiring (nets) among the cells has not been decided yet. Accordingly, a delay value for each pin is calculated by estimating a delay value, which may arise because of wiring (nets) among the cells, based on a Manhattan distance, and so on. Then, based on this calculated delay value, a timing check is performed for the arranging result of the arranging unit 32 (step S16), and determination is made as to whether error paths which do not satisfy the timing condition exist or not (step S17).

If error paths exist (NO determination is made in step S17), input pin replacing (step S18) or error contribution calculation and displaying (step S23) is performed. Here, either one of steps S18 or S23 may be executed. Alternatively, first, degree of error contribution is calculated and displayed in step S18, and if the result of timing check in step S16 is not OK even by performing arranging improvements by a specified number of times in step S15, input pin replacing may be executed in step S18.

Input pin replacing in step S18 may be manually performed by a designer by referring to the maximum value or the minimum value of an integrated delay value for each pin (value calculated during a timing check in step S16), a path delay value between each input pin and each output pin in the multi-input gate and a net delay value among the cells displayed in the display 21 as described later with reference to FIG. 12. Alternatively, input pin replacing may be performed automatically by the function of the input pin switching unit 43 as described later with reference to FIG. 13. In any of these cases, a delay improvement is performed so as to satisfy the timing condition by performing input pin replacing and reducing influence to the other paths as much as possible. After the input pin has been replaced by another, a timing check is performed again in step S16.

In step S23, the maximum value or the minimum value of an integrated delay value to each pin is calculated by the delay value calculating unit 36 while performing path tracing for the arranging result of the arranging unit 32 by the path tracing unit 35. Then, error importance calculation is performed by the error importance calculating unit 39 based on an expression described later. Specifically, degree Y of error importance is calculated according to a difference between a time t for reaching each pin and a reference time T for reaching the pin based on the maximum value or the minimum value of the integrated delay value.

Then, by the error contribution calculating unit 40, the degree Y of error importance is integrated for each pin and held in the error contribution counter of a table (see FIG. 9) for each pin. The degree of error contribution is displayed on the display 21 by the function of the display control unit (function ③ described above) The designer then carries out an arranging improvement in step S15 by referring to the degree of error contribution.

On the other hand, if no existence of any error paths is determined in step S17 (YES determination is made), wiring is performed among the cells which have been arranged in step S15 by the arranging unit 33 (step S19). In this case, wiring among the cells is performed according to a priority order based on the signal passing number counted in step S14. After wiring, operations similar to those in steps S16 to S18 and S23 described above are executed.

More particularly, according to the flowchart shown in FIG. 10 (described later), a delay value is calculated for each pin in the arranging result by the delay value calculating unit 36 based on an actual wiring length while performing path tracing by the path tracing unit for the wiring result. Then, a timing check is performed for the wiring result of the wiring unit 33 based on the delay value (step S20), and determination is made as to whether error paths which do not satisfy the Liming condition exist or not (step S21).

If error paths exist (NO determination is made in step S21), as in the case described above, input pin replacing is performed (step S22), or degree of error contribution is calculated and displayed (step S24). Herein also, only one of operations in steps S22 and S24 may be executed. Alternatively, first, error contribution calculation and displaying of step S24 may be performed, and if the result of a timing check in step S20 is not OK even by performing wiring improvements by a specified number of times in step S19, input pin replacing of step S22 may be performed.

Input pin replacing in step S22 is exactly the same as that in step S18 described above. Thus, the explanation of this operation will be omitted. After input pin replacing, a timing check is performed again in step S16.

Almost similarly to the processing in step S23, in step S24, the maximum value or the minimum value of an integrated delay value to each pin is calculated by the delay value calculating unit 36 while performing path tracing by the path tracing unit 35 for the wiring result of the wiring unit 33. Then, error importance calculation is performed by the error importance calculating unit 39 based on an expression described later. Specifically, degree Y of error importance is calculated according to a difference between a time t for reaching each pin and a reference time T for reaching the pin based on the maximum value or the minimum value of the integrated delay value.

Then, by the error contribution calculating unit 40, the degree Y of error importance is integrated for each pin and held in the error contribution counter of a table (see FIG. 9) for each pin. The degree of error contribution is displayed on the display 21 by the function of the display control unit 34 (function ③ described above). The designer then performs a wiring improvement by referring to the degree of error contribution in step S19.

Lastly, if no existence of any error paths is determined in step S21, circuit designing is finished. However, if no YES determination is made in step S17 or in step S21 even after an arranging/wiring improvement or input pin replacing has been performed repeatedly (error paths cannot be canceled), as in the case described above, the process returns to step S11 and logical designing needs to be performed all over again.

Next, the specific functions and operations of the circuit designing apparatus of the embodiment will be described with reference to FIGS. 8 to 13.

(1) Path Tracing Method and Delay Value Calculating Method

First, the path tracing and delay value calculating methods of the embodiment will be described by referring to FIGS. 8 to 10.

Figure 8B:
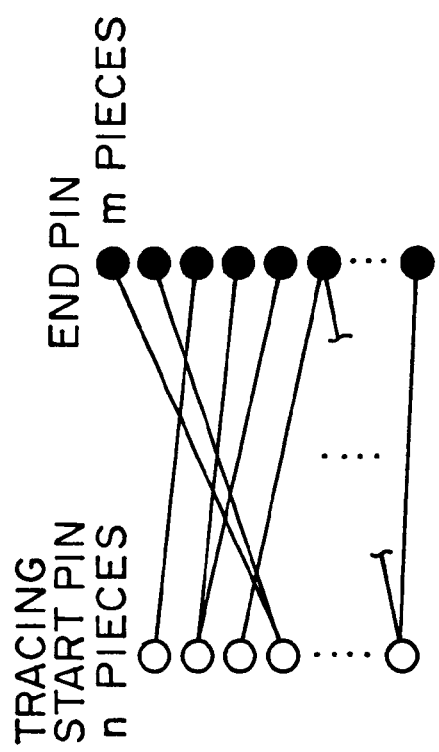
FIGS. 8(a) and 8(b) are views each Illustrating a path tracing method in the embodiment.
Figure 8A:
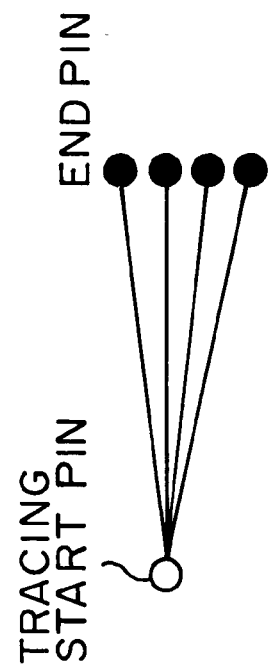

In the path tracing unit 35 of the embodiment, path tracing can be started from an optional pin in a LSI as a circuit to be designed. Also, path tracing can be simultaneously performed from optional starting points. For example, when tracing is started from one pin, as shown in FIG. 8(a), a plurality of paths can be found for one pin. When tracing is started simultaneously from n pieces of pins and m pieces of end pins are found as shown in FIG. 8(b), m pieces of paths can be found and a worst value (maximum value or a minimum value of a delay value described later) can be obtained for each end pin.

In addition, a table like that shown in FIG. 9 is provided for each pin of the cells (FFs, RAMs or various gates) arranged in the circuit to be designed. This table is used for holding various path tracing data, which have been obtained by performing path tracing with the path tracing unit 35. The contents of the table include data of 7 kinds ① to ⑦ described below.

① Pointer to the pin of the data base: Information indicating which pin in the circuit to be designed the table is used for.

② Backward link to the pin of the previous stage: Information indicating which pin in the previous stage reaches the pin. In other words, information indicating from which pin a path has reached the pin.

③ Event flag: A flag to be set when the table has an integrated delay value to the pin (delay up or delay down described later) written therein.

④ Delay up: The maximum value or the minimum value of an integrated delay value from a tracing start pin to the pin. In particular, a delay value of a rising signal.

⑤ Delay down: The maximum value or the minimum value of an integrated delay value from a tracing start pin to the pin. In particular, a delay value of a falling signal.

⑥ Signal passing counter: A region for holding the passing number of a path (signal) through the pin during path tracing. As described later with reference to FIG. 11, during path tracing performed by the path tracing unit 35, a value in this region is counted up by one by the passing number counting unit 38 each time a path passes through the pin (see step S14 in FIG. 17).

⑦ Error contribution counter: A region for holding degree of error contribution for the pin obtained by the error importance calculating unit 39 and the error contribution calculating unit 40 while performing path tracing, if an error path passes through the pin (see steps S23 and S24 in FIG. 7). The degree of error contribution will be described later in the section (3).

Hereinbelow, it is assumed for the purpose of simplifying the explanation that only one (e.g., delay up) of two kinds of delay values (delay up and delay down) is used.

Now, the path tracing and delay value calculating methods of the embodiment will be described by referring to the flowchart (steps S31 to S46) shown in FIG. 10. The methods shown in FIG. 10 are used during gate stage number calculation (see step S12 in FIG. 7), a timing check (steps S16 and S20 in FIG. 7) and error contribution calculation (steps S23 and S24 in FIG. 7). According to these methods, while the path tracing unit 35 performs path tracing from one or more tracing start pins for the logical designing result, the arranging result or the wiring result, the delay value calculating unit 36 calculates the maximum value or the minimum value of an integrated delay value from one or more of the tracing start pins to each pin of the cells to be arranged, through which a path has passed, and registers the integrated delay value in the table for each pin (see ④ or ⑤ in FIG. 9).

Figure 10:
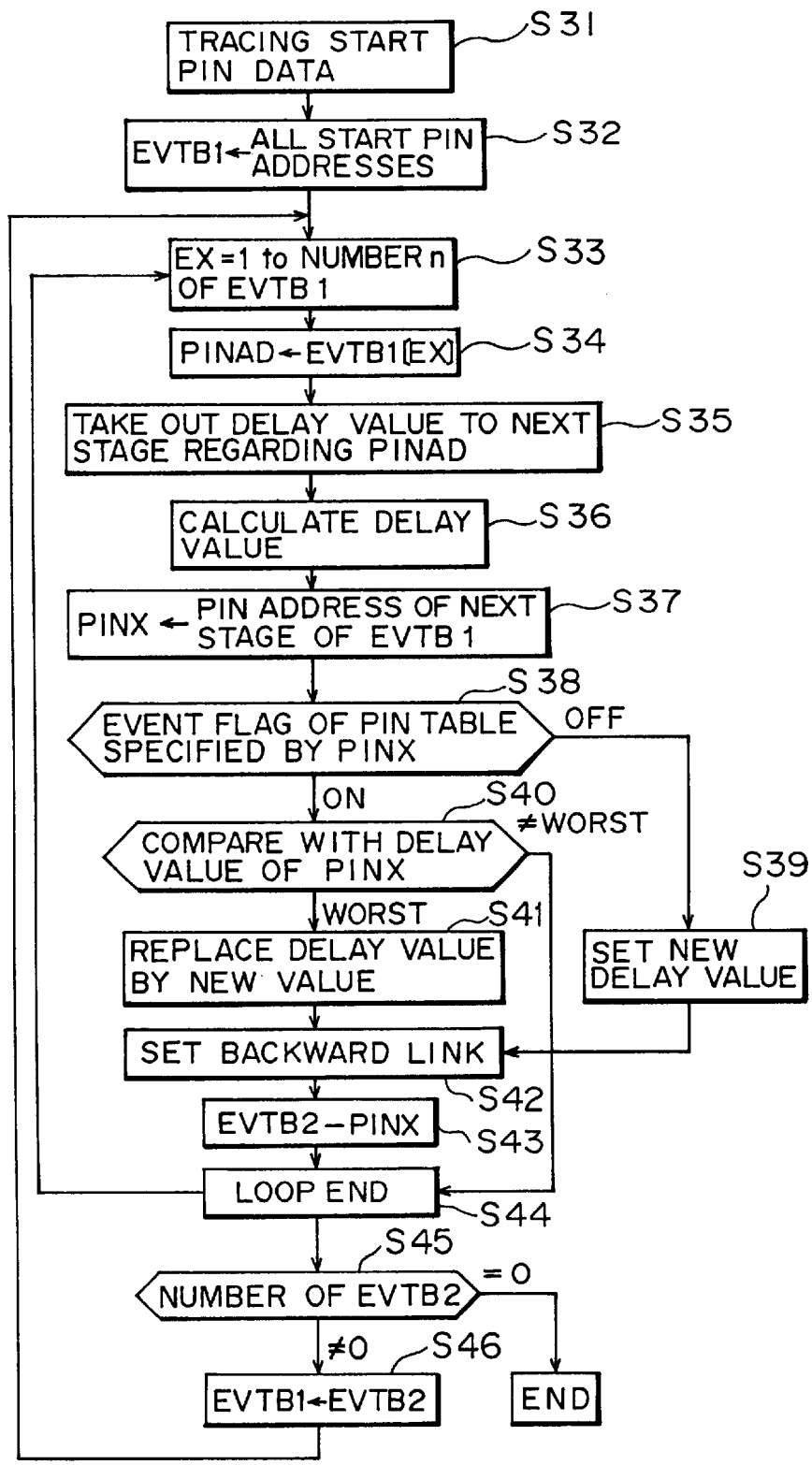
FIG. 10 is a flowchart illustrating the path tracing method and a delay value calculating method in the embodiment.

More particularly, as shown in FIG. 10, first, the path tracing unit 35 obtains data for tracing start pins from which tracing is to be started (step S31). Then, the path tracing unit 35 sets all the addresses of the start pins in the event table "EVTB1" (step S32).

The path tracing unit 35 then sets a variable "EX" for specifying address data (pin) set in the event table "EVTB1" (step S33). In order to execute the operations of steps S34 to S44 described later for all the address data (pin) set in the event table "EVTB1", this variable "EX" is incremented by one each time the operations of steps S34 to S44 are executed for one pin. Thus, the variable "EX" is incremented from 1 to n as the number of address data set in the event table "EVTB1".

The delay value calculating unit 36 reads address data "EVTB1[EX]" specified by this variable "EX" as a pin address "PINAD" (step S34), takes out a delay value to the pin of a next stage regarding this pin address "PINAD" from the data base 3 together with the address of the pin of the next stage (step S35) and calculates an integrated delay value (step S36). The path tracing unit 35 registers the address of the pin of the next stage as a pin address "PINX" (step S37).

The delay value calculating unit 36 refers to an event flag (see ③ in FIG. 9) for a table for the pin specified by the pin address "PINX" of the next stage and recognizes this event flag as ON or OFF (step S38). If the event flag is recognized as OFF, since a delay value has not been set in the table yet, a delay value newly calculated in step S36 is set in the table (step S39).

On the other hand, if the event flag is recognized as ON, the delay value calculating unit 36 makes a comparison between an integrated delay value newly calculated in step S36 and an integrated delay value which has already been set in the table for the pin specified by the pin address "PINX" (step S40). If the newly calculated delay value is worse, this value is replaced by the integrated delay value set in the table (step S41). If the value set in the table is worse, the process moves to step S44.

For path tracing of the embodiment, there are two tracing modes available, a MAX mode and a MIN mode. In the MAX (maximum) mode, if a newly calculated delay value (integrated delay value) is determined to be larger than a delay value which has already been set in the table in step S40 described later with reference to FIG. 10, the newly calculated delay value is written in the table as a worst value (step S41). In this case, the maximum value of an integrated delay value is calculated. Conversely, in the MIN (minimum) mode, if a newly calculated delay value is determined to be smaller than a delay value which has already been set in the table, the newly calculated delay value is written in the table as a worst value (step S41). In this case, the minimum value of n integrated delay value is calculated.

After the integrated delay value has newly been set in step S39, or after the integrated delay value in the table has been rewritten in step S41, the path tracing unit 35 sets the pin address "PINAD" as a backward link (see ② in FIG. 9) in the table for the pin specified by the pin address "PINX" (step S42).

Then, the path tracing unit 35 registers the address "PINX" of the pin of the next stage in an event table "EVTB2" (step S43). After registering, the path tracing unit 35 makes determination as to whether a loop end has been reached or not, that is, whether the variable "EX" has reached n as the number of address data set in the event table "EVTB1" or not (loop end) (step S44). If n has not been reached yet, the process returns to step S33. If the variable "EX" has reached n, determination is made as to whether the number of address data registered in the event table "EVTB2" is 0 or not (step S45). If the number of data is 0, path tracing is finished. If the number is not 0, the event table "EVTB2" is replaced by the event table "EVTB1" (step S46), and then the process returns again to step S33. Then, operations similar to those in steps S33 to S44 described above are executed for the new event table "EVTB1".

To sum up, while simultaneously performing path tracing from one or more tracing start pins, the maximum value or the minimum value of an integrated delay value from one or more of the tracing start pins to each pin is calculated, and then the integrated delay value is registered in the table for each pin.

(2) Signal Passing Number Counting Method

Now, the method of the embodiment for counting a signal passing number (path passing number) will be described by referring to the flowchart shown in FIG. 11 (steps S31 to S35, S37, S50 and S43 to S46). The method shown in FIG. 11 is used in step S14 shown in FIG. 7, and the path tracing method described above with reference to FIG. 10 is used. In other words, in the embodiment, the method shown in FIG. 11 is realized by setting of an external parameter so as to execute new step S50 between step S37 and S43 while omitting steps S36 and S38 to S42 show in FIG. 10.

Figure 11:
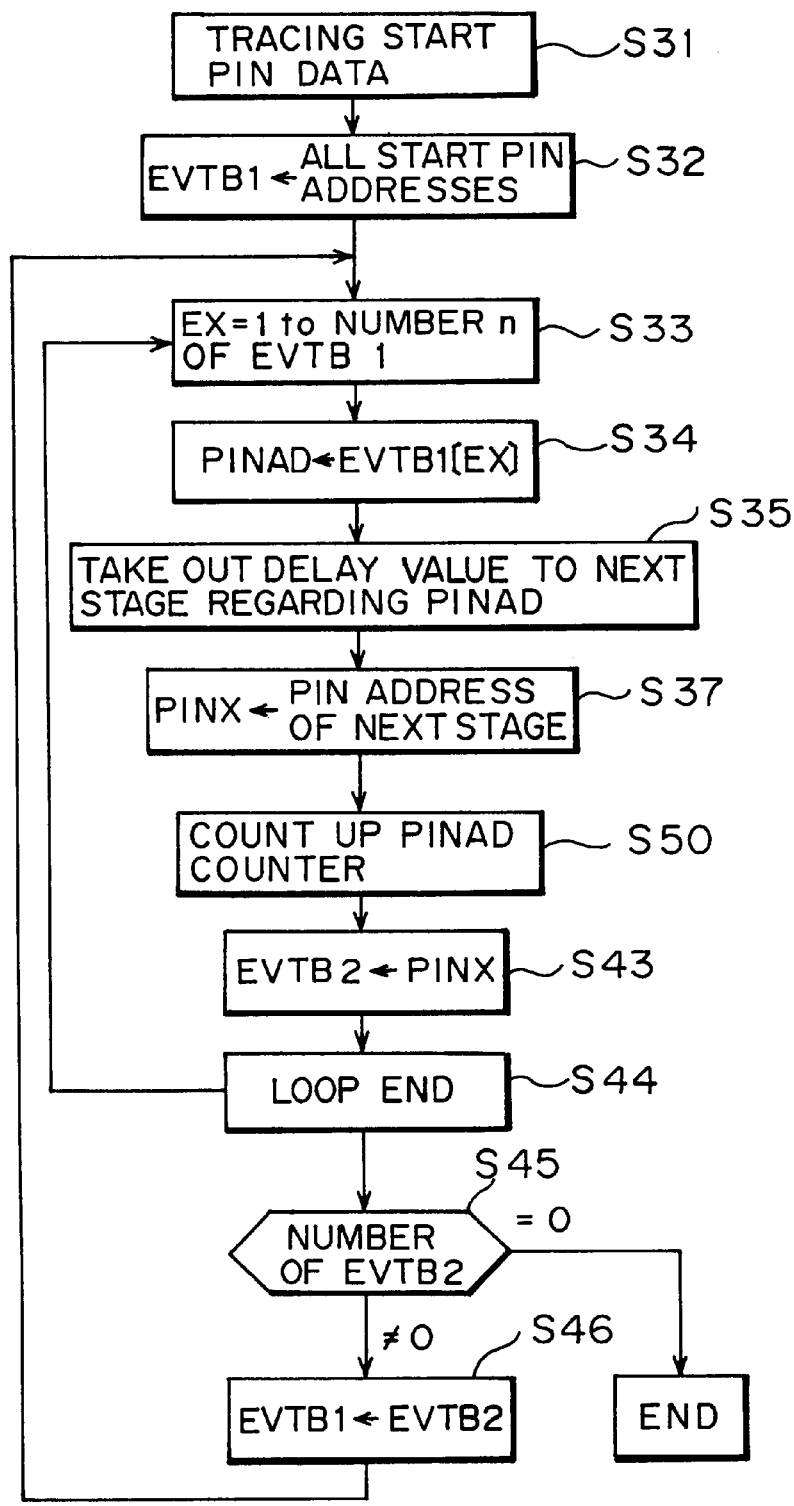
FIG. 11 is a flowchart illustrating a method for counting a path passing frequency through each pin in the embodiment.

According to the method shown in FIG. 11, the passing number counting unit 38 operates cooperatively with the path tracing unit 35 to count the passing number of a path through each pin while performing path tracing after logical designing and then registers the result of counting in the signal passing counter of the table for each pin (see ⑥ in FIG. 9).

For counting of the signal passing number, first signal passing counters in the tables corresponding to all the pins in a LSI are cleared to 0, and then path tracing is performed from each pin for all the input pins of the LSI or all the clock input pins of the FFs or the RAMs by using the same method as that described above with reference FIG. 10 (steps S31 to S35, and S37 shown in FIG. 11).

After the path tracing unit 35 has registered the address of the pin of the next stage read from the data base 23 as the pin address "PINX" in step S35, the passing number counting part 38 counts up the value of the signal passing counter in the table for the pin specified by the pin address "PINAD" by 1 (step S50). Thereafter, the delay value to the pin of the next stage read from the data base 23 in step S35 and regarding the pin address "PINAD" will never be used during counting of the signal passing number.

As described above, by performing path tracing for each pin from the input pins of the LSI or the clock pins of the FFs or the RAMs, a path (signal) passing number is counted by the signal passing counter in the table for each pin of the gates in the LSI. Accordingly, a signal propagating density for each pin, that is, a signal passing number in the LSI can be known.

This counting data is sorted for a signal passing number, passed to the arranging/wiring phase of the LSI (steps S15 and S19 in FIG. 7) and used as a yardstick for deciding a priority order for automatic arranging or automatic wiring.

Also, the counting data is displayed in a list on the window of the display 21 for displaying the nets and gates at the arranging/wiring phase by the function of the display control unit 34 described above. In addition to list displaying, the cells to be preferentially arranged/wired according to the counting data (arranging priority order) can be displayed with emphasis by changing display colors. In any case, information regarding a priority order for arranging/wiring can be provided to the designer.

To sum up, by counting the passing number of a path through each pin (static signal propagating density) while performing path tracing after logical designing and using this counting result as an index for arranging or wiring, arranging or wiring can be performed every efficiently by regulating the occurrence of error paths as much as possible. Also, when arranging is to be performed by the arranging unit 32 or wiring is to be performed by the wiring unit 33, even if it is difficult to reduce critical paths or improve a timing during arranging/wiring in the latter period of designing, a timing improvement can be performed every easily by giving a higher priority to a cell through which a path frequently passes. Accordingly, designing quality can be greatly improved.

(3) Method for Calculating Degree of Error Contribution (Counting Method)

Now, the method of the embodiment for calculating degree of error contribution will be described. This method is used in steps S23 and S24 in FIG. 7. If the result of a timing check performed for the arranging result of the arranging unit 32 or the wiring result of the wiring unit 33 (see steps S16 and S20 in FIG. 7) shows that a signal on a path does not arrive within a prescribed time or that the signal arrives too early (error paths exist), according to this error contribution calculating method, the error importance calculating unit 39 and the error contribution calculating unit 40 operate cooperatively with the path tracing unit 35 to calculate degree of error importance for each pin while performing path tracing. Then, the calculating result is registered in the error contribution counter (see ⑦ in FIG. 9) in the table for each pin.

For calculation of degree of error contribution, first, the error contribution counters in the tables corresponding to all the pins in the LSI are cleared to 0. Then, path tracing is performed from each pin for all the input pins of the LSI or all the clock pins of the FFs or the RAMs by using the same path tracing method as that described above with reference to FIG. 10.

Then, based on the maximum value or the minimum value of an integrated delay value calculated by the delay value calculating unit 36, degree Y of error importance is calculated by the error importance calculating unit 39 according to a difference (t-T) between a time t for reaching each pin and a reference time T for reaching the pin. With this difference (t-T) assumed to be X, degree Y of error importance is defined by an expression described below.

$Y = (X \cdot \alpha) + \beta$

Herein, $\alpha$ and $\beta$ are constants provided by the designer.

Degree Y of error importance calculated for each pin by the error importance calculating unit 39 is uniformly integrated to the error contribution counter in the table for each pin on the path.

By performing such an operation for all the paths, degree of error contribution for each pin is calculated. The pin which has large degree of error contribution has a problem in its arranging position. Thus, this pin plays a large role in the occurrence of error paths.

Degree of error contribution calculated in the manner described above is displayed in a list sorted in order of error contribution levels on the display 21 by the above-noted display function of the display control unit 34 when an improvement is to be made in arranging performed by the arranging unit 32 or in wiring performed by the wiring unit 33. In addition to list displaying, the pins having high degree of error contribution, that is, the pins having a high improving priority, or the nets accompanying the nets, can be displayed with emphasis by changing display colors thereof.

In any case, information regarding a priority order for an improvement in arranging/wiring is provided to the designer, and the importance of correcting the pins (or the nets accompanying the pins) can be notified to the designer. Accordingly, the designer can efficiently carry on with correcting work by performing corrections in order of the error contribution levels.

If $\alpha$ is set to 0 and $\beta$ is set to 1 in the expression for defining degree Y of error importance, degree of error importance integrated by the counter simply becomes an error path passing number. Accordingly, the signal passing counter can be used also as an error contribution counter.

(4) Gate Stage Number Calculating Method

Now, the method of the embodiment for calculating the number of gate stages will be described. This method is used in step S12 shown in FIG. 7. According to the gate stage number calculating method, the gate stage number calculating unit 41 operates cooperatively with the path tracing unit 35 and the delay value calculating unit 36 to calculate the number of gate stages among the FFs or between the input/output pins and the FFs in the logical designing result of the logical designing unit 31.

Originally, a delay value for each gate or each net calculated beforehand is held as a real number value in the data base 23. As described above, the delay value calculating unit 36 calculates an integrated delay value to each pin while reading a delay value held in the data base 23.

In the embodiment, the functions of the path tracing unit 35 and the delay value calculating unit 36 are also used when the number of gate stages among the FFs or between the input/output pins and the FFs is calculated by the gate stage number calculating unit 41.

More particularly, after logical designing performed by the logical designing unit 31, a unit delay value 1 is allocated to each of all the gates (cells) to be designed instead of a normal delay value, and a delay value 0 is allocated to each of all the nets among the cells. After allocation of these values, by the tracing unit 35 and the delay value calculating unit 36, an integrated delay value is calculated for each pin while performing path tracing simultaneously from the clock pins of all the FFs by using the same path tracing method as that described above with reference to FIG. 10.

An integrated delay value obtained as a result becomes a gate passing number from the FFs, and this passing number is sorted by the gate stage number calculating unit 41. The result of this sorting is displayed in a list or a graph on the display 21 by the above-noted function of the display control unit 34.

In the gate stage number checking unit 42, a comparison is made between the gate stage number calculated by the gate stage number calculating unit 41 and the gate stage number set beforehand. If any violating paths (paths which do not reach the prescribed gate stage number or paths which exceed the prescribed gate stage number) are discovered, the violating paths are sorted in order of gate stage numbers and displayed in a list on the display 21 by the above-noted function of the display control unit 34.

To sum up, since minimum and maximum stage numbers can be checked during logical designing and incorrect logical designing can be checked at an early stage, it is possible to discover a path which has a timing problem in the circuit to be designed during the initial designing stage of the LSI enlarged in size at an early time. Accordingly, the necessity of performing logical designing again after arranging or wiring is eliminated and a period needed for circuit designing can be greatly shortened by greatly reducing the number of designing steps.

In the embodiment, when a delay value is to be calculated while performing path tracing according to the method shown in FIG. 10, by selecting the MIN mode, a minimum gate stage number among the FFs or between the input/output pins and the FFs can be calculated and checked. In other words, whether a gate stage number is within a specified range or not can be checked.

Furthermore, in the example described above, a unit delay value 1 is uniformly allocated to each of all the gates. However, for a composite gate, a delay value with a weight equivalent to a stage number in the composite gate is allocated as a unit delay value, and thereby a proper gate stage number can be calculated.

(5) Displaying of Information for Input Pin Replacing

As described above, during designing of a LSI, arranging/wiring is decided by repeating packaging designing and a timing check so as to correct an incorrect timing. However, as described above, as a packaging change progresses to a certain extent, degree of permissibility for a change made in arranging/wiring becomes smaller and thus further changes become difficult. In the worst case, a logical change must be made.

In the embodiment, even when such a situation occurs, without changing logical designing, a timing can be improved only by changing the input pin of the same logic in the multi-input gate (input pin swapping), which is performed by using the function of the display control unit 34 and the function of the input pin switching unit 43 described later in the section (6). This processing is performed in step S18 or S22 shown in FIG. 7.

Generally, in the multi-input gate, a delay difference of about 50 to 100 ps (pico second) exists in a path from each input pin to an output pin because of its internal structure, and so on. This delay value for the path from each input pin to an output pin is a known value, which has been registered beforehand in the data base 23 conventionally. In the embodiment, this delay value is utilized and if a logic is not changed even after replacing of the input pin, a timing is improved by switching the input pin.

First, according to the method described above with reference to FIG. 10, path tracing is simultaneously started from all the input pins of the LSI or all the clock input pins of the FFs or the RAMs. The maximum value or the minimum value of an integrated delay value is calculated for each pin. Then, the integrated delay value is set in the delay up or the delay down region in the table corresponding to each pin.

The integrated delay value is then displayed on the display 21 together with a path delay value between each input pin and each output pin in the multi-input gate and a net delay value among the gates by the function of the display control unit 34. At this time, the integrated delay value is displayed in the neighborhood of a corresponding pin on the circuit which shows a worst path having a maximum or a minimum integrated delay value from the pin or on the list in a worst case path for the FF in the specified data receiving side. Accordingly, the designer can know which pin should be replaced.

A path delay value in the multi-input gate is displayed, for instance in a block which shows the gate. A net delay value among the gates is displayed, for instance in the neighborhood of the nets thereof.

Referring now to FIG. 12, there is shown a specific display example, which enables replacing of the input pin. In the drawing, there is shown a path from a FF-A, a FF-B, a FF-C and a FF-D as data transmitting sides, from which path tracing is started, to the input pin x of a FF-K as a data receiving side. Gates E to J exist between the FF-A, FF-B, FF-C and FF-D as the data transmitting sides and the FF-K as the data receiving side, and a path going through A-E-H-J-K is a worst path.

As described above, an integrated delay value is displayed in the neighborhood of each pin, a path delay value from each input pin to an output pin is displayed in each of the display blocks of the gates E to J and a net delay value between the FF-A to D and K or among the gates E to J is displayed in the neighborhood of the corresponding net.

For this circuit to be designed, it can be understood by referring to a display like that shown in FIG. 12 that if an operation is to be performed with all path delay values among the FFs set to, for instance 30 or lower, an integrated delay value for the input pin x of the FF-K is 31 and exceeds the value 30 by 1.

Paying attention to the gate J, there are paths b→z and c→z. Since a delay value for the path c→z is smaller by 2 than the delay value for the path b→z, if an input nets are switched between the pins b and c, a delay value for the path A-E-H-J (c→z) -K is 29 and a delay value for the path D-G-I-J (b→z) -K is 26. In this case, both values satisfy the timing condition (30 or lower).

Therefore, even when degree of permissibility for changing of an arrangement or wiring becomes very small, information regarding input pin swapping which enables cancellation of timing errors is displayed on the display 21 for the designer. Thus, the designer can determine which pin should be replaced in order to improve a timing by referring to the display on the display 21.

Accordingly, since timing errors can be canceled very easily by minimum changing of packaging data, that is, input pin swapping, without performing logical designing again, the number of designing steps can be greatly reduced and thereby a period for circuit designing can be greatly shortened.

(6) Input Pin Automatic Replacing Method

Figure 13:
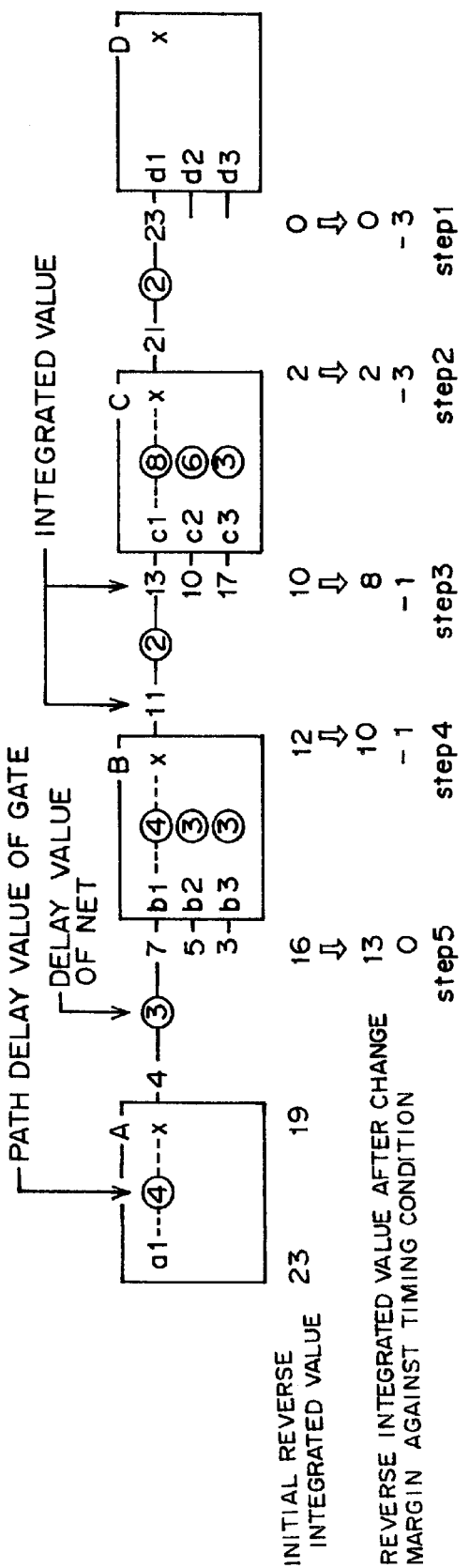
FIG. 13 is a view illustrating a procedure for performing automatic switching among the input pins in the embodiment.
Figure 14:
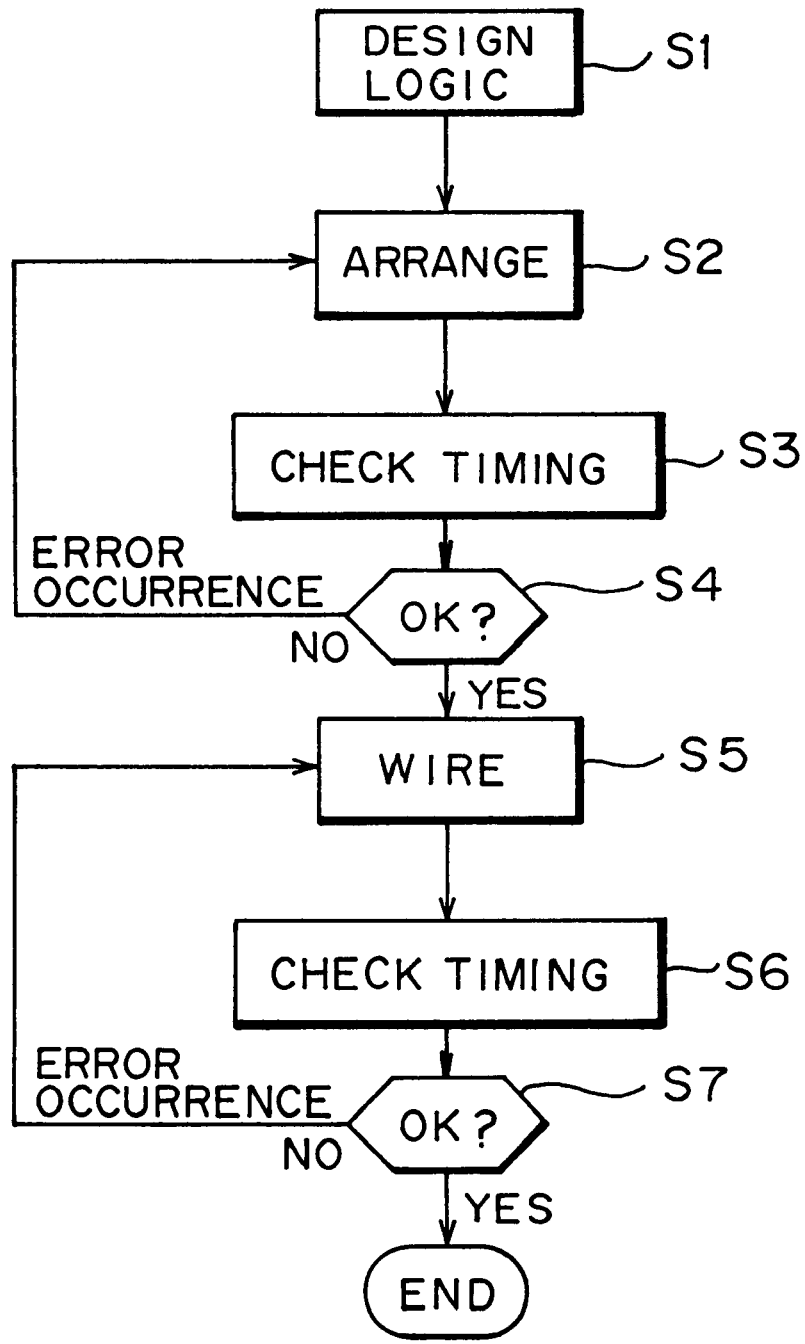
FIG. 14 is a flowchart illustrating a procedure for circuit designing.

Now, the input pin automatic replacing method by the input pin switching unit 43 will be described by referring to FIG. 13. In this input pin switching unit 43, net swapping is automatically performed in the multi-input gate according to a given timing condition based on various data displayed in the manner like that described above with reference to FIG. 12 and thereby a timing is improved.

First, according to the method described above with reference to FIG. 10, path tracing is simultaneously started from all the input pins of the LSI or all the clock pins of the FFs or the RAMs, and an integrated delay value is calculated for each pin. Then, a delay value among the FFs is checked according to the timing condition. For a worst path which has become an error as a result of the checking, operations ① to ⑧ described below are performed by the input pin switching part 43.

① By referring to a backward link (see ② in FIG. 9) to the previous stage pin in the table provided for each pin, a route for the worst path is found by reversibly moving up from the pin in the path receiving side (back tracing).

② By reversibly moving up from the end point for each stage, the operations ③ to ⑧ described below are repeated.

③ A reverse integrated delay value from the previous stage pin to the end point is calculated.

④ If a reverse upward movement is made from the output pin of the multi-input gate to the input pin by back tracing, a path with a small delay value other than the worst path is sought among path delay values in the multi-input gate.

⑤ If a value obtained by adding the reverse delay value to the integrated value of the input pin of the path is lower than the timing condition, net replacing is performed.

⑥ A reverse integrated delay value after the change is calculated based on the integrated delay value of the path which has replaced the previous path.

⑦ A margin against the timing condition is calculated.

⑧ If a margin is 0 or higher, the operation is finished.

A specific procedure for automatic input net replacing performed by the input pin switching unit 43 for the circuit shown in FIG. 13 (gates A to D) will be described below. In this case, a timing condition is set to 20 or lower.

Step 1: Since the timing condition is 20 or lower, a margin −3 is set for the input pin d1 of the gate D.

Step 2: Since a net delay value from the gate D to the gate C is 2, a reverse integrated delay value 2 is set for the output pin x of the gate C before the gate D. A margin for this output pin x is also −3.

Step 3: In the gate C, since a path delay value from the input pin c3 to the output pin x is 3, the net of the worst path connected to the input pin c1 can be replaced by that of the input pin c3. However, since an integrated delay value for the input pin c3 is 17, after the nets have been switched between the input pins c1 and c3, a path delay value reaching the end point through the input pin c3 is 17+8+2=27, which exceeds the timing condition 20. Therefore, switching of the nets between such input pins cannot be performed.

On the other hand, a path delay value reaching the end point through the input pin c2 is 10+8+2=20, which permits switching between the input pins. Accordingly, the nets are switched between the input pin c1 and c2. A reverse integrated delay value 6+2=8 after the change is set for the input pin c2 of the gate C and a margin −3+2=−1 is also set.

Step 4: Since a net delay value from the gate C to the gate B before the same is 2, a reverse integrated delay value 8+2=10 is set for the output pin x of the gate B. A margin for this output pin x is also −1.

Step 5: After switching of the nets between the input pins b1 and b2 in the gate B, an integrated delay value for the input pin b2 is 5, a path delay value from the input pin b1 to the output pin x is 4 and a reverse integrated value for the output pin x is 10. Accordingly, a delay value for a path which passed through the input pin b2 but now reaches the gate D through the input pin b1 because of the input pin switching is 5+4+10=19, which permits switching of the nets.

After switching of the nets between the input pins b2 and b1, an integrated delay value for the input pin b1 is 7, a path delay value from the input pin b2 to the output pin x is 3 and a reverse integrated delay value for the output pin x is 10. Accordingly, a delay value for a path which reaches the input pin d1 of the gate D from the input pin a1 of the gate A through the input pin b2 is 7+3+10=20, which satisfies the timing condition. Since a path delay value difference after the input pin switching is 4−3=1, a margin for the input pin b2 is −1+1=0.

Consequently, by performing input pin switching between the gates B and C, a delay improvement can be made so as to satisfy the timing condition while limiting influence to the other paths as much as possible.

To sum up, even when degree of permissibility for making a change in an arrangement or wiring becomes extremely small, minimum changing of packaging data, that is, input pin switching, is automatically performed by the input pin switching unit 43 and a timing error can be canceled (corrected) extremely easily without performing logical designing again. Accordingly, the number of designing steps is greatly reduced and thereby a period for circuit designing is greatly shortened.

In the embodiment described above, the logical designing unit 31, the arranging unit 32, the wiring unit 33, and so on, are realized in one CPU 20a. However, the present invention is not limited to the specifically described embodiment. The functions of the logical designing unit 31, the arranging unit 32 and the wiring unit 33 may be realized in separate processors. By using the processors respectively having these functions represented by codes 35 to 43, various operations like those described above may be performed for a logical designing result, an arranging result or a wiring result obtained by each processor. In the case of this construction, it is needless to say that the same effects as those by the embodiment described above can also be obtained.

Furthermore, in the foregoing specific embodiment, explanation was made of the case of LSI designing. However, the present invention is not limited to designing of the LSI. The present invention can be applied to designing of an electronic circuit such as a printed wiring board or the like and effects similar to those described above can be obtained.

What is claimed is:

1. A method for designing an integrated circuit which includes a multiplicity of cells arranged in a predetermined area on a substrate, each cell having at least one input pin and at least one output pin, and a multiplicity of wires routed in the predetermined area on the substrate, each wire interconnecting between one output pin of one cell, and one input pin of another cell of the multiple cells, said method comprising:

(a) generating a logic design for the integrated circuit to be designed, said logic design defining the required multiple cells and a multiplicity of nets, each of the nets representing an interconnecting relationship between one output pin of one cell and one input pin of another cell of the multiple cells for a prospective routing of each of the multiple wires;

(b) arranging the multiple cells in the predetermined area on the substrate based on said logic design obtained in said step (a);

(c) routing the multiple wires in the predetermined area on the substrate to interconnect between the multiple cells arranged in said step (b) based on said logic design obtained in said step (a);

(d) performing path tracing based on at least one of said logic design obtained in said step (a), said arrangement of the multiple cells in said step (b) and said routing of the multiple wires in said step (c), by designating at least one pin of the multiple cells as a start pin and by tracing one or more paths from said start pin along the alternatively successive cells and nets;

(e) calculating a characteristic timing delay, which includes at least one of a maximum and a minimum timing delay, for each of the pins on each of said paths traced in said step (d), said characteristic timing delay being a total of cell delays and net delays for all cells and nets located between said start pin and each said pin along each said path;

(f) calculating an error importance score for each said pin on each said path, said error importance score representing a difference between said characteristic timing delay calculated for each said pin on each said path in said step (e) and a reference delay predetermined for each said pin on each said path;

(g) calculating an error contribution score for each of the pins of the multiple cells, said error contribution score being a total score of the error importance scores, each calculated in said step (f), for all of the paths for each said pin of the multiple cells; and (h) displaying on a display unit data representing at least one of said logic design obtained in said step (a), said arrangement of the multiple cells in said step (b) and said routing of the multiple wires in said step (c) with data representing said error contribution score calculated for each said pin of the multiple cells in said step (g), thereby allowing at least one of said arrangement of the multiple cells in said step (b) and said routing of the multiple wires in said step (c) to be performed or re-performed based on said error contribution score.

2. A method for designing an integrated circuit which includes a multiplicity of cells arranged in a predetermined area on a substrate, each cell having at least one input pin and at least one output pin, and a multiplicity of wires routed in the predetermined area on the substrate, each wire interconnecting between one output pin of one cell and one input pin of another cell of the multiple cells, said method comprising:

(a) generating a logic design for the integrated circuit to be designed, said logic design defining the required multiple cells and a multiplicity of nets, each of the nets representing an interconnecting relationship between one output pin of one cell and one input pin of another cell of the multiple cells for a prospective routing of each of the multiple wires;

(b) arranging the multiple cells in the predetermined area on the substrate based on said logic design obtained in said step (a);

(c) routing the multiple wires in the predetermined area on the substrate to interconnect between the multiple cells arranged in said step (b) based on said logic design obtained in said step (a);

(d) performing path tracing based on at least one of said logic design obtained in said step (a), said arrangement of the multiple cells in said step (b) and said routing of the multiple wires in said step (c), by selecting at least one pin of the multiple cells as a start pin and by tracing one or more paths from said start pin along the alternatively successive cells and nets;

(e) calculating a characteristic timing delay, which includes at least one of a maximum and a minimum timing delay, for each of pins on each of said paths traced in said step (d), said characteristic timing delay being a total of cell delays and net delays for all cells and nets located between said start pin and each said pin along each said path; and (f) calculating a number of gate stages between each two successive sequential-circuit cells, which each function as sequential logic, among the cells located on each said path or between each of input/output terminals on the substrate and a sequential-circuit cell adjacent to each said input/output terminals among the cells located on each said path, based on said characteristic timing delay calculated in said step (e) with assuming that each of the cell delays is a unit delay value and that each of the net delays is 0, wherein at least one of said arrangement of the multiple cells in said step (b) and said routing of the multiple wires in said step (c) is performed or re-performed based on said gate stage number calculated in said step (f).

3. A method as claimed in claim 2, further comprising checking that said gate stage number calculated in said step (f) meets a predetermined constraint.

4. A method as claimed in claim 3, further comprising displaying on a display unit a result of the checking of said gate stage number in said checking step.

5. A method as claimed in claim 2, further comprising displaying on a display unit data representing said gate stage number calculated in said step (f).

6. A method for designing an integrated circuit which includes a multiplicity of cells arranged in a predetermined area on a substrate, each cell having at least one input pin and at least one output pin, and a multiplicity of wires routed in the predetermined area on the substrate, each wire interconnecting between one output pin of one cell and one input pin of another cell of the multiple cells, said method comprising:

(a) generating a logic design for the integrated circuit to be designed, said logic design defining the required multiple cells and a multiplicity of nets, each of the nets representing an interconnecting relationship between one output pin of one cell and one input pin of another cell of the multiple cells for a prospective routing of each of the multiple wires;

(b) arranging the multiple cells in the predetermined area on the substrate based on said logic design obtained in said step (a);

(c) routing the multiple wires in the predetermined area on the substrate to interconnect between the multiple cells arranged in said step (b) based on said logic design obtained in said step (a);

(d) performing path tracing based on at least one of said logic design obtained in said step (a), said arrangement of the multiple cells in said step (b) and said routing of the multiple wires in said step (c), by selecting at least one pin of the multiple cells as a start pin and by tracing one or more paths from said start pin along the alternatively successive cells and nets;

(e) calculating a characteristic timing delay, which includes at least one of a maximum and a minimum timing delay, for each of pins on each of said paths traced in said step (d), said characteristic timing delay being a total of cell delays and net delays for all cells and nets located between said start pin and each said pin along each said path;

(f) calculating a number of gate stages between each two successive sequential circuit cells, which each function as sequential logic, among the cells located on each said path or between each of input/output terminals on the substrate and a sequential-circuit cell adjacent to each said input/output terminals among the cells located on each said path, based on said characteristic timing delay calculated in said step (e) with assuming that each of the cell delays is a unit delay value and that each of the net delays is 0; and (g) displaying on a display unit data representing at least one of said logic design obtained in said step (a), said arrangement of the multiple cells in said step (b) and said routing of the multiple wires in said step (c) with data representing said gate stage number calculated in said step (f), thereby allowing at least one of said arrangement of the multiple cells in said step (b) and said routing of the multiple wires in said step (c) to be performed or re-performed based on said gate stage number.

7. A method for designing an integrated circuit which includes a multiplicity of cells arranged in a predetermined area on a substrate, each cell having at least one input pin and at least one output pin, and a multiplicity of wires routed in the predetermined area on the substrate, each wire interconnecting between one output pin of one cell and one input pin of another cell of the multiple cells, said method comprising:

(a) generating a logic design for the integrated circuit to be designed, said logic design defining the required multiple cells and a multiplicity of nets, each of the nets representing an interconnecting relationship between one output pin of one cell and one input pin of another cell of the multiple cells for a prospective routing of each of the multiple wires;

(b) arranging the multiple cells in the predetermined area on the substrate based on said logic design obtained in said step (a);

(c) routing the multiple wires in the predetermined area on the substrate to interconnect between the multiple cells arranged in said step (b) based on said logic design obtained in said step (a);

(d) performing path tracing based on at least one of said logic design obtained in said step (a), said arrangement of the multiple cells in said step (b) and said routing of the multiple wires in said step (c), by selecting at least one pin of the multiple cells as a start pin and by tracing one or more paths from said start pin along the alternatively successive cells and nets;

(e) calculating a characteristic timing delay, which includes at least one of a maximum and a minimum timing delay, for each of pins on each of said paths traced in said step (d), said characteristic timing delay being a total of cell delays and net delays for all cells and nets located between said start pin and each said pin along each said path;

(f) designating at least one pin of the multiple cells as a target pin and checking that said characteristic timing delay calculated for said target pin in said step (e) meets a predetermined timing constraint for said target pin; and (g) compensating, if any characteristic timing delay of said target pin has been judged to violate the predetermined timing constraint in said step (f), for the violation by (i) selecting a critical path from the paths traced through said target pin, said critical path having the characteristic timing delay which violates the predetermined timing constraint, (ii) selecting gate cells having a plurality of input pins and located on the critical path and between said start pin and said target pin, (iii) estimating a plurality of gate delays for each of the gate cells selected in said (ii), each of said plural gate delays being a delay between a respective one of the plural input pins and the output pin of each said gate cell, (iv) selecting one gate cell from the gate cells selected in said (ii) based on said plural gate delays estimated for each said gate cell in said (iii), (v) switching a connection between one input pin of the one gate cell selected in said (iv) and the corresponding net on the critical path into a connection between another input pin of the one selected gate cell and the corresponding net, thereby creating a new path other than the critical path, and (vi) checking that a characteristic timing delay along the new path for said target pin meets the predetermined timing constraint for said target pin, wherein at least one of said arrangement of the multiple cells in said step (b) and said routing of the multiple wires in said step (c) is performed or re-performed based on the result of said compensation in said step (g).

8. A method for designing an integrated circuit which includes a multiplicity of cells arranged in a predetermined area on a substrate, each cell having at least one input pin and at least one output pin, and a multiplicity of wires routed in the predetermined area on the substrate, each wire interconnecting between one output pin of one cell and one input pin of another cell of the multiple cells, said method comprising:

(a) generating a logic design for the integrated circuit to be designed, said logic design defining the required multiple cells and a multiplicity of nets, each of which nets represents an interconnecting relationship between one output pin of one cell and one input pin of another cell of the multiple cells for a prospective routing of each of the multiple wires;

(b) arranging the multiple cells in the predetermined area on the substrate based on said logic design obtained in said step (a);

(c) routing the multiple wires in the predetermined area on the substrate to interconnect between the multiple cells arranged in said step (b) based on said logic design obtained in said step (a);

(d) performing path tracing based on at least one of said logic design obtained in said step (a), said arrangement of the multiple cells in said step (b) and said routing of the multiple wires in said step (c), by selecting at least one pin of the multiple cells as a start pin and by tracing one or more paths from said start pin along the alternatively successive cells and nets;

(e) calculating a characteristic timing delay, which includes at least one of a maximum and a minimum timing delay, for each of pins on each of said paths traced in said step (d), said characteristic timing delay being a total of cell delays and net delays for all cells and nets located between said start pin and each said pin along each said path; and (f) displaying on a display unit information regarding at least one target pin in the multiple cells, the information including, (i) said characteristic timing delay calculated for all of the paths in said step (e) for each of pins which are located on each of the paths traced through said target pin and are also located between said start pin and said target pin, (ii) a plurality of gate delays for each of gate cells which each has a plurality of input pins and which are located on each of the paths traced through said target pin and are also located between said start pin and said target pin, each of said plural gate delays being an estimated delay between a respective one of the plural input pins and the output pin of each said gate cell, (iii) a net delay for each of nets which are located on each of the paths traced through said target pin and are also located between said start pin and said target pin, said net delay being an estimated delay of each said net, and (iv) a worst path in the paths traced through said target pin, said worst path having the minimum or maximum characteristic timing delay among characteristic timing delays of the through-target-pin paths, thereby allowing at least one of said arrangement of the multiple cells in said step (b) and said routing of the multiple wires in said step (c) to be performed or re-performed based on said displayed information.

9. A method for designing an integrated circuit which includes a multiplicity of cells arranged in a predetermined area on a substrate, each cell having at least one input pin and at least one output pin and a multiplicity of wires routed in the predetermined area on the substrate, each wire interconnecting between one output pin of one cell and one input pin of another cell of the multiple cells, said method comprising:

(a) generating a logic design for the integrated circuit to be designed, said logic design defining the required multiple cells and a multiplicity of nets, each of the nets representing an interconnecting relationship between one output pin of one cell and one input pin of another cell of the multiple cells, for a prospective routing of each of the multiple wires;

(b) arranging the multiple cells in the predetermined area on the substrate based on said logic design obtained in said step (a);

(c) routing the multiple wires in the predetermined area or the substrate to interconnect between the multiple cells arranged in said step (b) based on said logic design obtained in said step (a);

(d) performing path tracing based on at least one of said logic design obtained in said step (a), said arrangement of the multiple cells in said step (b) and said routing of the multiple wires in said step (c), by selecting at least one pin of the multiple cells as a start pin and by tracing one or more paths from said start pin along the alternatively successive cells and nets; and (e) calculating a characteristic timing delay, which includes at least one of a maximum and a minimum timing delay, for each of pins on each of said paths traced in said step (d), said characteristic timing delay being a total of cell delays and net delays for all cells and nets located between said start pin and each said pin along each said path;

at least one of said arrangement of the multiple cells in said step (b) and said routing of the multiple-wires in said step (c) being performed or re-performed based on said characteristic timing delay calculated for each said pin on each said path in said step (e).

10. A circuit designing apparatus for designing an integrated circuit which includes a multiplicity of cells arranged in a predetermined area on a substrate, each cell having at least one input pin and at least one output pin, and a multiplicity of wires routed In the predetermined area on the substrate, each wire interconnecting between one output pin of one cell and one input pin of another cell of the multiple cells, comprising:

(a) a logical designing unit generating a logic design for the integrated circuit to be designed, said logic design defining the required multiple cells and a multiplicity of nets, each of which nets represents an interconnecting relationship between one output pin of one cell and one input pin of another cell of the multiple cells for a prospective routing of each of the multiple wires;

(b) an arranging unit arranging the multiple cells in the predetermined area on the substrate based on said logic design obtained by said logical designing unit;

(c) a wiring unit routing the multiple wires in the predetermined area on the substrate to interconnect between the multiple cells arranged by said arranging unit based on said logic design obtained by said logical designing unit;

(d) a path tracing unit performing path tracing based on at least one of said logic design obtained by said logical designing unit, the arrangement of the multiple cells by said arranging unit and the routing of the multiple wires by said wiring unit, by designating at least one pin of the multiple cells as a start pin and by tracing one or more paths from said start pin along the alternatively successive cells and nets;

(e) a delay calculating unit calculating a characteristic timing delay, which includes at least one of a maximum and a minimum timing delay, for each of pins on each of said paths traced by said path tracing unit, said characteristic timing delay being a total of cell delays and net delays for all cells and nets located between said start pin and each said pin along each said path;

(f) an error-importance-score calculating unit calculating an error importance score for each said pin on each said path, said error importance score representing a difference between said characteristic timing delay calculated for each said pin on each said path by said delay calculating unit and a reference delay predetermined for each said pin on each said path;

(g) an error-contribution-score calculating unit calculating an error contribution score for each of the pins of the multiple cells, said error contribution score being a total score of the error importance scores, each calculated by said error-importance-score calculating unit for all of the paths for each said pin of the multiple cells;

(h) a display unit displaying various data regarding circuit designing;

(i) a display control unit controlling said display unit to display data representing at least one of the logic design obtained by said logic design unit, the arrangement of the multiple cells by said arranging unit and the routing of the multiple wires by said wiring unit with data representing said error contribution score calculated for each said pin of the multiple cells by said error-contribution-score calculating unit; and (j) an input unit inputting to at least one of said arranging unit and said routing unit various instructions regarding circuit designing in response to the various data displayed by said display unit, wherein at least one of said arranging unit and said routing unit is capable of responding to the various instructions inputted through said input unit, thereby allowing at least one of the arrangement of the multiple cells and the routing of the multiple wires to be performed or re-performed based on said error contribution score calculated by said error-contribution-score calculating unit.

11. A circuit designing apparatus for designing an integrated circuit which includes a multiplicity of cells arranged in a predetermined area on a substrate, each cell having at least one input pin and at least one output pin, and a multiplicity of wires routed in the predetermined area on the substrate, each wire interconnecting between one output pin of one cell and one input pin of another cell of the multiple cells, said apparatus comprising:

(a) a logical designing unit generating a logic design for the integrated circuit to be designed, said logic design defining the required multiple cells and a multiplicity of nets, each of the nets representing an interconnecting relationship between one output pin of one cell and one input pin of another cell of the multiple cells for a prospective routing of each of the multiple wires;

(b) an arranging unit arranging the multiple cells in the predetermined area on the substrate based on said logic design obtained by said logical designing unit;

(c) a wiring unit routing the multiple wires in the predetermined area on the substrate to interconnect between the multiple cells arranged by said arranging unit based on said logic design obtained by said logical designing unit;

(d) a path tracing unit performing path tracing based on at least one of said logic design obtained by said logical designing unit, the arrangement of the multiple cells by said arranging unit and the routing of the multiple wires by said wiring unit, by designating at least one pin of the multiple cells as a start pin and by tracing one or more paths from said start pin along the alternatively successive cells and nets;

(e) a delay calculating unit calculating a characteristic timing delay, which includes at least one of a maximum and a minimum timing delay, for each of pins on each of said paths traced by said path tracing unit, said characteristic timing delay being a total of cell delays and net delays for all cells and nets located between said start pin and each said pin along each said path; and (f) a gate-stage-number calculating unit causing said delay calculating unit to calculate said characteristic timing delay for each of the pins of the multiple cells among all timing delays assuming that each of the cell delays is a unit delay value and that each of the net delays is 0, and calculating a number of gate stages between each two successive sequential-circuit cells, which each function as sequential logic among the cells located on each said path or between each of input/output terminals on the substrate and a sequential-circuit cell adjacent to each said input/output terminals among the cells located on each said path, based on said characteristic timing delay calculated by said delay calculating unit at least one of said arranging unit and said routing unit being operable to perform or re-perform at least one of the arrangement of the multiple cells and the routing of the multiple wires based on said gate stage number calculated by said gate-stage-number calculating unit.

12. A circuit designing apparatus as claimed in claim 11, further comprising a gate-stage-number checking unit checking that said gate stage number calculated by said gate-stage-number calculating unit meets a predetermined constraint.

13. A circuit designing apparatus as claimed in claim 12, further comprising:

a display unit displaying various data regarding circuit designing; and a display control unit controlling said display unit to display data representing at least one of the logic design obtained by said logic design unit, the arrangement of the multiple cells by said arranging unit and the routing of the multiple wires by said wiring unit with data representing a result of the checking of said gate stage number by said gate-stage-number checking unit.

14. A circuit designing apparatus as claimed in claim 11, further comprising:
- a display unit displaying various data regarding circuit designing; and
- a display control unit controlling said display unit to display data representing at least one of the logic design obtained by said logic design unit, the arrangement of the multiple cells by said arranging unit and the routing of the multiple wires by said wiring unit with data representing said gate stage number calculated by said gate-stage-number calculating unit.

15. A circuit designing apparatus for designing an integrated circuit which includes a multiplicity of cells arranged in a predetermined area on a substrate, each cell having at least one input pin and at least one output pin, and a multiplicity of wires routed in the predetermined area on the substrate, each wire interconnecting between one output pin of one cell and one input pin of another cell of the multiple cells, comprising:

(a) a logical designing unit generating a logic design for the integrated circuit to be designed, said logic design defining the required multiple cells and a multiplicity of nets, each of which nets represents an interconnecting relationship between one output pin of one cell and one input pin of another cell of the multiple cells for a prospective routing of each of the multiple wires;

(b) an arranging unit arranging the multiple cells in the predetermined area on the substrate based on said logic design obtained by said logical designing unit;

(c) a wiring unit routing the multiple wires in the predetermined area on the substrate to interconnect between the multiple cells arranged by said arranging unit based on said logic design obtained by said logical designing unit;

(d) a path tracing unit performing path tracing based on at least one of said logic design obtained by said logical designing unit, the arrangement of the multiple cells by said arranging unit and the routing of the multiple wires by said wiring unit by designating at least one pin of the multiple cells as a start pin and by tracing one or more paths from said start pin along the alternatively successive cells and nets;

(e) a delay calculating unit calculating a characteristic timing delay, which includes at least one of a maximum and a minimum timing delay, for each of pins on each of said paths traced by said path tracing unit, said characteristic timing delay being a total of cell delays and net delays for all cells and nets located between said start pin and each said pin along each said path;

(f) a gate-stage-number calculating unit causing said delay calculating unit to calculate said characteristic timing delay for each of the pins of the multiple cells among all timing delays assuming that each of the cell delays is a unit delay value and that beach of the net delays is 0, and calculating a number of gate stages between each two successive sequential-circuit cells, each of which function as sequential logic, among the cells located on each said path or between each of input/output terminals on the substrate and a sequential-circuit cell adjacent to each said input/output terminals among the cells located on each said path, based on said characteristic timing delay calculated by said delay calculating unit;

(g) a display unit displaying various data regarding circuit designing;

(h) a display control unit controlling said display unit to display data representing said gate stage number calculated by said gate-stage-number calculating unit; and (i) an input unit inputting to at least one of said arranging unit and said routing unit various instructions regarding circuit designing in response to the various data displayed by said display unit;

at least one of said arranging unit and said routing unit being capable of responding to the various instructions inputted through said input unit, thereby allowing at least one of the arrangement in said arranging unit and the routing in said routing unit to be performed or re-performed based on said gate stage number calculated by said gate-stage-number calculating unit.

16. A circuit designing apparatus for designing an integrated circuit which includes a multiplicity of cells arranged in a predetermined area on a substrate, each cell having at least one input pin and at least one output pin, and a multiplicity of wires routed in the predetermined area on the substrate, each wire interconnecting between one output pin of one cell and one input pin of another cell of the multiple cells, said apparatus comprising:

(a) a logical designing unit generating a logic design for the integrated circuit to be designed, said logic design defining the required multiple cells and a multiplicity of nets, each of which nets represents an interconnecting relationship between one output pin of one cell and one input pin of another cell of the multiple cells for a prospective routing of each of the multiple wires:

(b) an arranging unit arranging the multiple cells in the predetermined area on the substrate based on said logic design obtained by said logical designing unit;

(c) a wiring unit routing the multiple wires in the predetermined area on the substrate to interconnect between the multiple cells arranged by said arranging unit based on said logic design obtained by said logical designing unit;

(d) a path tracing unit performing path tracing based on at least one of said logic design obtained by said logical designing unit, the arrangement of the multiple cells by said arranging unit and the routing of the multiple wires by said wiring unit, by designating at least one pin of the multiple cells as a start pin and by tracing one or more paths from said start pin along the alternatively successive cells and nets;

(e) a delay calculating unit calculating a characteristic timing delay, which includes at least one of a maximum and a minimum timing delay, for each of pins on each of said paths traced by said path tracing unit, said characteristic timing delay being a total of cell delays and net delays for all cells and nets located between said start pin and each said pin along each said path;

(f) a timing check unit designating at least one pin of the multiple cells as a target pin and checking that said characteristic timing delay calculated for said target pin by said delay calculating unit meets a predetermined timing constraint for said target pin; and (g) an input pin switching unit, responsive to the judgment by said timing check unit that any characteristic timing delay of said target pin violates the predetermined timing constraint, for compensating for the violation by (i) selecting a critical path from the paths traced through said target pin, said critical path having the characteristic timing delay which violates the predetermined timing constraint, (ii) selecting gate cells having a plurality of input pins and located on the critical path and between said start pin and said target pin, (iii) estimating a plurality of gate delays for each of the gate cells selected in said (ii), each of said plural gate delays being a delay between a respective one of the plural input pins and the output pin of each said gate cell, (iv) selecting one gate cell from the gate cells selected in said (ii) based on said plural gate delays estimated for each said gate cell in said (iii), (v) switching a connection between one input pin of the one gate cell selected in said (iv) and the corresponding net on the critical path into a connection between another input pin of the one selected gate cell and the corresponding net, thereby creating a new path instead of the critical path, and (vi) checking that a characteristic timing delay along the new path for said target pin meets the predetermined timing constraint for said target pin, wherein at least one of said arranging unit and said routing unit is capable of performing at least one of the arrangement of the multiple cells and the routing of the multiple wires based on the result of the compensation by said input pin switching unit.

17. A circuit designing apparatus for designing an integrated circuit which includes a multiplicity of cells arranged in a predetermined area on a substrate, each cell having at least one input pin and at least one output pin, and a multiplicity of wires routed in the predetermined area on the substrate, each wire interconnecting between one output pin of one cell and one input pin of another cell of the multiple cells, comprising:

(a) a logical designing unit generating a logic design for the integrated circuit to be designed, said logic design defining the required multiple cells and a multiplicity of nets, each of the nets representing an interconnecting relationship between one output pin of one cell and one input pin of another cell of the multiple cells for a prospective routing of each of the multiple wires;

(b) an arranging unit arranging the multiple cells in the predetermined area on the substrate based on said logic design obtained by said logical designing unit;

(c) a wiring unit routing the multiple wires in the predetermined area on the substrate to interconnect between the multiple cells arranged by said arranging unit based on said logic design obtained by said logical designing unit;

(d) a path tracing unit performing path tracing based on at least one of said logic design obtained by said logical designing unit, the arrangement of the multiple cells by said arranging unit and the routing of the multiple wires by said wiring unit, by designating at least one pin of the multiple cells as a start pin and by tracing one or more paths from said start pin along the alternatively successive cells and nets;

(e) a delay calculating unit calculating a characteristic timing delay, which includes at least one of a maximum and a minimum timing delay, for each of pins on each of said paths traced by said path tracing unit, said characteristic timing delay being a total of cell delays and net delays for all cells and nets located between said start pin and each said pin along each said path;

(f) a display unit displaying various data regarding circuit designing;

(g) a display control unit controlling said display unit to display items of information regarding at least one target pin in the multiple cells, the information including (i) said characteristic timing delay calculated for all of the paths by said delay calculating unit for each of pins which are located on each of the paths traced through said target pin and are also located between said start pin and said target pin, (ii) a plurality of gate delays for each of gate cells which each has a plurality of input pins and which are located on each of the paths traced through said target pin and are also located between said start pin and said target pin, each of said plural gate delays being an estimated delay between a respective one of the plural input pins and the output pin of each said gate cell, (iii) a net delay for each of nets which are located on each of the paths traced through said target pin and are also located between said start pin and said target pin, said net delay being an estimated delay of each said net, and (iv) a worst path in the paths traced through said target pin, said worst path having the minimum or maximum characteristic timing delay among characteristic timing delays of the through-target-pin paths; and (h) an input unit inputting to at least one of said arranging unit and said routing unit various instructions regarding circuit designing in response to the various data displayed by said display unit;

at least one of said arranging unit and said routing unit being operable responsively to the various instructions inputted through said input unit, thereby allowing at least one of the arrangement in said arranging unit and the routing in said routing unit to be performed or re-performed based on said items of information displayed in said displaying unit.

18. A circuit designing apparatus for designing an integrated circuit which includes a multiplicity of cells arranged in a predetermined area on a substrate, each cell having at least one input pin and at least one output pin, and a multiplicity of wires routed in the predetermined area on the substrate, each wire interconnecting between one output pin of one cell and one input pin of another cell of the multiple cells, comprising:

(a) a logical designing unit generating a logic design for the integrated circuit to be designed, said logic design defining the required multiple cells and a multiplicity of nets, each of the nets representing an interconnecting relationship between one output pin of one cell and one input pin of another cell of the multiple cells for a prospective routing of each of the multiple wires;

(b) an arranging unit arranging the multiple cells in the predetermined area on the substrate based on said logic design obtained by said logical designing unit;

(c) a wiring unit routing the multiple wires in the predetermined area on the substrate to interconnect between the multiple cells arranged by said arranging unit based on said logic design obtained by said logical designing unit;

(d) a path tracing unit performing path tracing based on at least one of said logic design obtained by said logical designing unit, the arrangement of the multiple cells by said arranging unit and the routing of the multiple wires by said wiring unit, by designating at least one pin of the multiple cells as a start pin and by tracing one or more paths from said start pin along the alternatively successive cells and nets;

(e) a delay calculating unit calculating a characteristic timing delay, which includes at least one of a maximum and a minimum timing delay, for each of pins on each of said paths traced by said path tracing unit, said characteristic timing delay being a total of cell delays and net delays for all cells and nets located between said start pin and each said pin along each said path; and at least one of said arranging unit and said routing unit being operable to perform or re-perform at least one of the arrangement of the multiple cells and the routing of the multiple wires based on said characteristic timing delay calculated for each said pin on each said path by said delay calculating unit.

* * * * *

UNITED STATES PATENT AND TRADEMARK OFFICE
CERTIFICATE OF CORRECTION

PATENT NO. : 6,308,305 B1
DATED : October 23, 2001
INVENTOR(S) : Hiroyuki Sugiyama et al.

It is certified that error appears in the above-identified patent and that said Letters Patent is hereby corrected as shown below:

<u>Column 30,</u>
Line 57, change "In" to -- in --.

Signed and Sealed this

Nineteenth Day of March, 2002

Attest:

JAMES E. ROGAN
Attesting Officer
Director of the United States Patent and Trademark Office